US010940674B2

(12) United States Patent
Shiraokawa et al.

(10) Patent No.: US 10,940,674 B2
(45) Date of Patent: Mar. 9, 2021

(54) RESIN VARNISH, PREPREG, LAMINATE, AND PRINTED WIRING BOARD

(71) Applicant: HITACHI CHEMICAL COMPANY, LTD., Tokyo (JP)

(72) Inventors: Yoshikatsu Shiraokawa, Tokyo (JP); Minoru Kakitani, Tokyo (JP); Hiroshi Shimizu, Tokyo (JP); Keisuke Kushida, Tokyo (JP); Tatsunori Kaneko, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/538,557

(22) PCT Filed: Dec. 7, 2016

(86) PCT No.: PCT/JP2016/086456
§ 371 (c)(1),
(2) Date: Jun. 21, 2017

(87) PCT Pub. No.: WO2018/105070
PCT Pub. Date: Jun. 14, 2018

(65) Prior Publication Data
US 2019/0338093 A1 Nov. 7, 2019

(51) Int. Cl.
*B32B 15/092* (2006.01)
*B32B 15/20* (2006.01)
*C08L 63/00* (2006.01)
*H05K 1/03* (2006.01)

(52) U.S. Cl.
CPC ............ *B32B 15/092* (2013.01); *B32B 15/20* (2013.01); *C08L 63/00* (2013.01); *H05K 1/0353* (2013.01); *B32B 2260/046* (2013.01); *B32B 2307/306* (2013.01); *B32B 2457/08* (2013.01)

(58) Field of Classification Search
CPC .............. B32B 15/20; B32B 2307/306; B32B 2260/046; B32B 15/14; B32B 5/024; B32B 5/08; B32B 5/26; B32B 15/12; B32B 15/18; B32B 2262/062; B32B 2262/0223; B32B 2260/021; B32B 2255/205; B32B 2250/40; B32B 2262/02; B32B 2262/0276; B32B 2255/06; B32B 2262/0269; B32B 2262/10; B32B 2262/0253; B32B 2260/028; B32B 2307/3065; B32B 2307/20; B32B 2262/0246; B32B 2307/732; B32B 2307/7246; B32B 2262/101; B32B 2307/206; B32B 2262/14; B32B 29/005; B32B 5/022; B32B 2457/08; B32B 15/08; C08L 63/00; C08J 2363/00; C08J 5/24; C09D 163/00; C09D 179/04; C09D 7/61; H05K 1/0353
See application file for complete search history.

(56) References Cited

U.S. PATENT DOCUMENTS

| 3,985,928 A | 10/1976 | Watanabe et al. | |
|---|---|---|---|
| 2007/0077413 A1 | 4/2007 | Amou et al. | |
| 2010/0143728 A1 | 6/2010 | Tsuchikawa | |
| 2010/0279129 A1 | 11/2010 | Tsuchikawa et al. | |
| 2011/0120761 A1* | 5/2011 | Kawai .................. | H05K 1/0353 174/258 |
| 2013/0330563 A1* | 12/2013 | Kotake ................ | C08G 73/125 428/447 |
| 2015/0267047 A1 | 9/2015 | Takahashi | |
| 2016/0369042 A1* | 12/2016 | Nii .............................. | C08J 5/24 |
| 2017/0156207 A1 | 6/2017 | Tsuchikawa | |

FOREIGN PATENT DOCUMENTS

| CN | 103232682 A | 8/2013 |
|---|---|---|
| EP | 2141198 A1 | 1/2010 |
| JP | 50-153098 A | 12/1975 |
| JP | 56-133355 A | 10/1981 |
| JP | 58-69046 A | 4/1983 |
| JP | 58-164638 A | 9/1983 |
| JP | 61-18937 B2 | 5/1986 |
| JP | 61-286130 A | 12/1986 |
| JP | 62-148512 A | 7/1987 |
| JP | 2-208355 A | 8/1990 |
| JP | 6-179734 A | 6/1994 |
| JP | 2008-133353 A | 6/2008 |
| JP | 2010-53334 A | 3/2010 |

(Continued)

OTHER PUBLICATIONS

Cray Valley, Technical Data Sheet: SMA® EF80. Mar. 2016 (Year: 2016).*
International Search Report for PCT/JP2016/086456 dated Feb. 21, 2017; English translation submitted herewith (6 pages).
Written Opinion of the International Searching Authority for PCT/JP2016/086456 dated Feb. 21, 2017; English translation submitted herewith (8 pages).
Search Report of European of Appln. No. 16880183.5 dated Oct. 30, 2017 in English.
Office Action of corresponding Korean Application dated Sep. 11, 2017.
Office Action of JP Appln. No. 2017-522683 dated Aug. 22, 2017.

*Primary Examiner* — John D Freeman
(74) *Attorney, Agent, or Firm* — Fitch, Even, Tabin & Flannery, LLP

(57) ABSTRACT

The present invention provides a resin varnish, a prepreg, a laminate and a printed wiring board, using a thermosetting resin composition having high heat resistance, low relative permittivity, high metal foil adhesion, high glass transition temperature and low thermal expansion and excellent in moldability and platability. Specifically, the resin varnish contains (A) a maleimide compound, (B) an epoxy resin, (C) a copolymer resin having a structural unit derived from an aromatic vinyl compound and a structural unit derived from a maleic anhydride, (D) a silica treated with an aminosilane coupling agent, and (G) an organic solvent.

16 Claims, No Drawings

(56) References Cited

FOREIGN PATENT DOCUMENTS

| | | |
|---|---|---|
| JP | 2011-006683 A | 1/2011 |
| JP | 2012-153896 A | 8/2012 |
| JP | 2012-229363 A | 11/2012 |
| JP | 2015-112007 A | 6/2015 |
| JP | 2016-008229 A | 1/2016 |
| JP | 2016-017091 A | 2/2016 |
| JP | 2016-033195 A | 3/2016 |
| JP | 2016-060780 A | 4/2016 |
| JP | 2016-222837 A | 12/2016 |
| KR | 2009-0074171 | 7/2009 |
| TW | 201518403 A | 5/2015 |
| WO | 2009/081601 A1 | 7/2009 |
| WO | WO-2015001764 A1 * | 1/2015 |
| WO | 2016-114030 A1 | 7/2016 |
| WO | 2016-175326 A1 | 11/2016 |
| WO | 2016-194927 A1 | 12/2016 |
| WO | 2016/194927 A1 | 12/2016 |
| WO | 2018/105071 A1 | 6/2018 |

\* cited by examiner

RESIN VARNISH, PREPREG, LAMINATE, AND PRINTED WIRING BOARD

CROSS-REFERENCE TO RELATED APPLICATIONS

This application is a U.S. national phase application filed under 35 U.S.C. § 371 of International Application No. PCT/JP2016/086456, filed Dec. 7, 2016 designating the United States, the complete disclosures of which is hereby incorporated herein by reference in its entirety for all purposes.

TECHNICAL FIELD

The present invention relates to a resin varnish favorable as a material for electronic devices, and to a prepreg, a laminate and a printed wiring board.

BACKGROUND ART

Recently, in mother boards for multifunctional cell-phone units and the like, the ratio of line width (L) to space (S) [L/S] in a wiring board has become narrowed with advanced high-speed communication, wiring densification and ultra-thinning of wiring boards. With such narrowing of L/S, it has become difficult to stably produce wiring boards at high yield. In conventional planning of wiring boards, a layer with no wiring pattern, called a "skip layer" is partly arranged. With increased functionality of electronic devices, the wiring design volume comes to increase and the number of layers in a wiring board thereby increase, but by arranging the above-mentioned skip layer, there occurs a problem in that the thickness of the mother board further increases.

As a method of solving these problems, it is effective to reduce the relative permittivity of the insulating material to be used in the wiring board. Reduction in the relative permittivity of the insulating material facilitates L/S impedance control, therefore enabling stable production of intended wiring boards with currently planned L/S, and accordingly, it becomes possible to reduce the number of layers by thinning out skip layers. Accordingly, insulating materials for use in wiring boards are required to satisfy material characteristics of small relative permittivity.

Recently, with advanced large-scale integration in electronic devices, materials having a low relative permittivity capable of satisfying a demand for device thinning have become desired also for mother boards for much thinned and low-priced cell phones and others. In addition, also communication system devices as typified by servers, routers and portable base stations have become used in a higher frequency band region, and a high-melting-point lead-free solder has become used for soldering of electronic parts, and consequently, as materials for substrates for use in these, those having a low dielectric constant and a high glass transition temperature (high Tg) and excellent in reflow heat resistance have become desired.

In mother boards for use in multifunctional cell-phone units and the like, the layers are desired to be connected through small laser vias, with increase in the wiring density and reduction in the pattern width. From the viewpoint of connection reliability, filled plating is employed in many cases, and since the connection in the interface between inner copper and plating copper is extremely important, improving the laser workability of substrates is desired.

After laser working of substrates, in general, a step of removing a residual component of resin (desmearing step) is carried out. Desmearing treatment is carried out on the bottom and the side wall of a laser via, and therefore, in the case where a large amount of the resin component of a substrate dissolves in desmearing treatment, the shape of the laser via would be significantly deformed owing to dissolution of resin. In addition, there may occur other various problems of uneven plating owing to variability in irregularities on the side wall. From this, it is desired that the amount of the resin component of a substrate to dissolve in desmearing treatment, that is, the desmearing dissolution amount could be an adequate value.

Heretofore, for preparing a thermosetting resin composition having a small relative permittivity, there have been employed a method of blending an epoxy resin having a small relative permittivity, a method of introducing a cyanate group, a method of blending a polyphenylene ether, etc. However, merely by combining these methods in a simple manner, it is still difficult to satisfy various requirements of reduced relative permittivity, increased heat resistance, reliability and halogen freeness. For example, there have been proposed a resin composition containing an epoxy resin (see PTL 1), a resin composition containing a polyphenylene ether and a bismaleimide (see PTL 2), a resin composition containing a polyphenylene ether and a cyanate resin (see PTL 3), a resin composition containing at least one of a styrenic thermoplastic elastomer or the like, and/or a triallyl cyanurate or the like (see PTL 4), a resin composition containing a polybutadiene (see PTL 5), a resin composition prepared by pre-reacting a polyphenylene ether resin, a polyfunctional maleimide and/or a polyfunctional cyanate resin, and a liquid polybutadiene (see PTL 6), a resin composition containing an unsaturated double bond group-having compound-imparted or grafted polyphenylene ether, and a triallyl cyanurate and/or a triallyl isocyanurate (see PTL 7), a resin composition containing a reaction product of a polyphenylene ether and an unsaturated carboxylic acid or unsaturated acid anhydride, and a polyfunctional maleimide (see PTL 8), etc.

CITATION LIST

Patent Literature

PTL 1: JP-A 58-69046
PTL 2: JP-A 56-133355
PTL 3: JP-B 61-18937
PTL 4: JP-A 61-286130
PTL 5: JP-A 62-148512
PTL 6: JP-A 58-164638
PTL 7: JP-A 2-208355
PTL 8: JP-A 6-179734

SUMMARY OF INVENTION

Technical Problem

The resin compositions described in PTLs 1-8 could show a relatively good relative permittivity, but many of them could not satisfy the severe demand in recent markets. In addition, in many cases, any of high heat resistance, high metal foil adhesion, high glass transition temperature, low thermal expansion, moldability and platability (laser workability) is insufficient, and there is still room for further improvement. In addition, the fact is that material development could not be achieved sufficiently from the viewpoint of satisfying platability.

Consequently, an object of the present invention is to provide a resin varnish, a prepreg, a laminate and a printed wiring board having high heat resistance, low relative permittivity, high metal foil adhesion, high glass transition temperature and low thermal expansion, and excellent in moldability and platability.

Solution to Problem

The present inventors have assiduously studied for the purpose of solving the above-mentioned problems and, as a result, have found that a resin varnish containing "(A) a maleimide compound", "(B) an epoxy resin", "(C) a copolymer resin having a specific structural unit", "(D) a silica treated with an aminosilane coupling agent" and "(G) an organic solvent" can solve the above-mentioned problems, and have completed the present invention. In particular, the inventors have found that, when a maleimide compound having an acidic substituent and an N-substituted maleimide group, which is obtained by reacting (a1) a maleimide compound having at least two N-substituted maleimide groups in one molecule, (a2) a monoamine compound having an acidic substituent, and (a3) a diamine compound, is used as the maleimide compound (A), the advantageous effects of the present invention can be greatly enhanced to solve the above-mentioned problems with ease. The present invention has been completed on the basis of these findings.

The present invention relates to the following [1] to [16].
[1] A resin varnish containing:
   (A) a maleimide compound,
   (B) an epoxy resin,
   (C) a copolymer resin having a structural unit derived from an aromatic vinyl compound and a structural unit derived from a maleic anhydride,
   (D) a silica treated with an aminosilane coupling agent, and
   (G) an organic solvent.
[2] The resin varnish according to the above [1], wherein the component (A) is a maleimide compound having an acidic substituent and an N-substituted maleimide group, which is obtained by reacting (a1) a maleimide compound having at least two N-substituted maleimide groups in one molecule, (a2) a monoamine compound having an acidic substituent, and (a3) a diamine compound.
[3] The resin varnish according to the above [1] or [2], wherein the component (A) is a maleimide compound having an acidic substituent and an N-substituted maleimide group, which is obtained by reacting (a1) a maleimide compound having at least two N-substituted maleimide groups in one molecule, (a2) a monoamine compound represented by the following general formula (a2-1), and (a3) a diamine compound represented by the following general formula (a3-1):

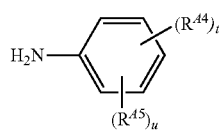
(a2-1)

wherein $R^{44}$ represents an acidic substituent selected from a hydroxy group, a carboxy group and a sulfonic acid group, $R^{45}$ represents an alkyl group having 1 to 5 carbon atoms, or a halogen atom, t represents an integer of 1 to 5, u represents an integer of 0 to 4, and t and u satisfy $1 \leq t+u \leq 5$, provided that when t is an integer of 2 to 5, plural $R^{44}$'s may be the same or different, and when u is an integer of 2 to 4, plural $R^{45}$'s may be the same or different;

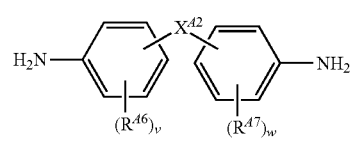
(a3-1)

wherein $X^{A2}$ represents an aliphatic hydrocarbon group having 1 to 3 carbon atoms, or —O—, $R^{46}$ and $R^{47}$ each independently represent an alkyl group having 1 to 5 carbon atoms, a halogen atom, a hydroxy group, a carboxy group or a sulfonic acid group, and v and w each independently represent an integer of 0 to 4.
[4] The resin varnish according to any of the above [1] to [3], wherein the component (C) is a copolymer resin having a structural unit represented by the following general formula (C-i) and a structural unit represented by the following formula (C-ii);

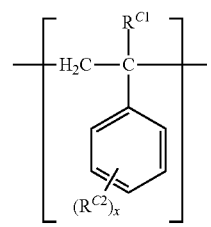
(C-i)

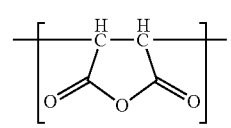
(C-ii)

wherein $R^{C1}$ represents a hydrogen atom, or an alkyl group having 1 to 5 carbon atoms, $R^{C2}$ represents an alkyl group having 1 to 5 carbon atoms, an alkenyl group having 2 to 5 carbon atoms, an aryl group having 6 to 20 carbon atoms, a hydroxy group, or a (meth)acryloyl group, and x represents an integer of 0 to 3, provided that when x is 2 or 3, plural $R^{C2}$'s may be the same or different.
[5] The resin varnish according to the above [4], wherein in the general formula (C-i), $R^{C1}$ is a hydrogen atom and x is 0.
[6] The resin varnish according to any of the above [1] to [3], wherein in the component (C), the content ratio of the structural unit derived from an aromatic vinyl compound to the structural unit derived from a maleic anhydride [aromatic vinyl compound-derived structural unit/maleic anhydride-derived structural unit] (molar ratio) is from 2 to 9.
[7] The resin varnish according to any of the above [1] to [3], wherein in the component (C), the content ratio of the structural unit derived from an aromatic vinyl compound to the structural unit derived from a maleic anhydride [aromatic vinyl compound-derived structural unit/maleic anhydride-derived structural unit] (molar ratio) is from 3 to 7.
[8] The resin varnish according to any of the above [1] to [7], wherein the weight average molecular weight of the component (C) is from 4,500 to 18,000.

[9] The resin varnish according to any of the above [1] to [8], wherein the weight average molecular weight of the component (C) is from 9,000 to 13,000.
[10] The resin varnish according to any of the above [1] to [9], wherein the component (B) is a bisphenol F-type epoxy resin, a phenol-novolak-type epoxy resin, a cresol-novolak-type epoxy resin, a naphthalene-type epoxy resin, an anthracene-type epoxy resin, a biphenyl-type epoxy resin, a biphenylaralkyl-type epoxy resin or a dicyclopentadiene-type epoxy resin.
[11] The resin varnish according to any of the above [1] to [10], further containing (E) a curing agent.
[12] The resin varnish according to any of the above [1] to [11], further containing (F) a flame retardant.
[13] The resin varnish according to any of the above [1] to [12], wherein the organic solvent (G) is at least one selected from the group consisting of an alcohol solvent, a ketone solvent, an ether solvent, an aromatic solvent, a nitrogen atom-containing solvent, a sulfur atom-containing solvent and an ester solvent.
[14] A prepreg containing a resin varnish of any of the above [1] to [13].
[15] A laminate containing a prepreg of the above [14] and a metal foil.
[16] A printed wiring board provided with a laminate of the above [15].

Advantageous Effects of Invention

According to the present invention, there are provided a resin varnish, a prepreg, a laminate and a printed wiring board having high heat resistance, low relative permittivity, high metal foil adhesion, high glass transition temperature and low thermal expansion, and excellent in moldability and platability.

DESCRIPTION OF EMBODIMENTS

The present invention is described in detail hereinunder. In this description, preferred embodiments may be selected arbitrarily and preferred embodiments may be combined arbitrarily.
The present invention provides a thermosetting resin composition containing an organic solvent, that is, a resin varnish. In the present invention, for convenience sake, a thermosetting resin composition having a solid concentration of 30 to 90% by mass is referred to as a resin varnish, and a thermosetting resin composition not containing an organic solvent and a thermosetting resin composition having a solid concentration of less than 30% by mass each are simply referred to as a thermosetting resin composition.
The resin varnish of the present invention contains a thermosetting resin composition described below.
[Thermosetting Resin Composition]
The thermosetting resin composition contains:
(A) a maleimide compound,
(B) an epoxy resin,
(C) a copolymer resin having a structural unit derived from an aromatic vinyl compound and a structural unit derived from a maleic anhydride, and
(D) a silica treated with an aminosilane coupling agent.
The components that the thermosetting resin composition contains are described in detail hereinunder.
<(A) Maleimide Compound>
The component (A) is a maleimide compound (hereinafter this may be referred to as a maleimide compound (A)), and is not specifically limited so far as it is a compound having a maleimide group, but is preferably a maleimide compound having an N-substituted maleimide group. From the viewpoint of the advantageous effects of the present invention, especially the effect of greatly improving platability, the compound is more preferably a maleimide compound having an acidic substituent and an N-substituted maleimide group, even more preferably a maleimide compound having an acidic substituent and an N-substituted maleimide group which is obtained by reacting (a1) a maleimide compound having at least two N-substituted maleimide groups in one molecule [hereinafter this may be abbreviated as "maleimide compound (a1)"], (a2) a monoamine compound having an acidic substituent [hereinafter this may be abbreviated as "monoamine compound (a2)"], and (a3) a diamine compound [hereinafter this may be abbreviated as "diamine compound (a3)"], and especially preferably a maleimide compound having an acidic substituent and an N-substituted maleimide group which is obtained by reacting (a1) a maleimide compound having at least two N-substituted maleimide groups in one molecule, (a2) a monoamine compound represented by the following general formula (a2-1):

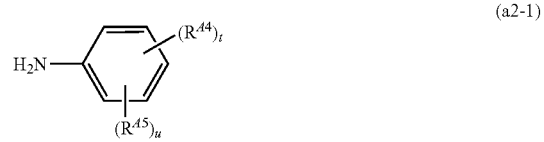

(a2-1)

wherein $R^{44}$ represents an acidic substituent selected from a hydroxy group, a carboxy group and a sulfonic acid group, $R^{45}$ represents an alkyl group having 1 to 5 carbon atoms, or a halogen atom, t represents an integer of 1 to 5, u represents an integer of 0 to 4, and t and u satisfy 1 t+u 5, provided that when t is an integer of 2 to 5, plural $R^{44}$'s may be the same or different, and when u is an integer of 2 to 4, plural $R^{45}$'s may be the same or different; and (a3) a diamine compound represented by the following general formula (a3-1);

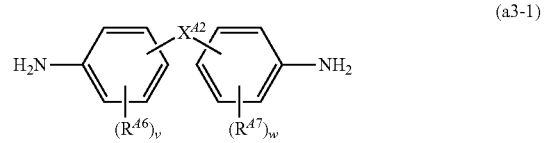

(a3-1)

wherein $X^{42}$ represents an aliphatic hydrocarbon group having 1 to 3 carbon atoms, or —O—, $R^{46}$ and $R^{47}$ each independently represent an alkyl group having 1 to 5 carbon atoms, a halogen atom, a hydroxy group, a carboxy group or a sulfonic acid group, and v and w each independently represent an integer of 0 to 4.
In the following, the description relating to the maleimide compound (A) may be read as a description of the above-mentioned maleimide compound having an acidic substituent and an N-substituted maleimide compound.
The weight average molecular weight (Mw) of the maleimide compound (A) is, from the viewpoint of solubility in organic solvent and from the viewpoint of mechanical strength, preferably 400 to 3,500, more preferably 600 to 2,300, even more preferably 800 to 2,000. The weight average molecular weight in this description is a value measured according to a gel permeation chromatography (GPC) method (standard polystyrene-equivalent conversion value) using tetrahydrofuran as an eluent, and is more specifically a value measured according to the method described in the section of Examples.

(Maleimide Compound (a1))

The maleimide compound (a1) is a maleimide compound having at least two N-substituted maleimide groups in one molecule.

The maleimide compound (a1) includes a maleimide compound having an aliphatic hydrocarbon group between arbitrary two maleimide groups among plural maleimide groups therein [hereinafter referred to as an aliphatic hydrocarbon group-containing maleimide), and a maleimide compound having an aromatic hydrocarbon group between arbitrary two maleimide groups among plural maleimide groups therein [hereinafter referred to as an aromatic hydrocarbon group-containing maleimide]. Among these, an aromatic hydrocarbon group-having maleimide is preferred from the viewpoint of high heat resistance, low relative permittivity, high metal foil adhesion, high glass transition temperature, low thermal expansion, moldability and platability. The aromatic hydrocarbon group-containing maleimide may contain an aromatic hydrocarbon group between any combinations of arbitrarily selected two maleimide groups.

The maleimide compound (a1) is, from the viewpoint of high heat resistance, low relative permittivity, high metal foil adhesion, high glass transition temperature, low thermal expansion, moldability and platability, preferably a maleimide compound having 2 to 5 N-substituted maleimide groups in one molecule, more preferably a maleimide compound having two N-substituted maleimide groups in one molecule. Also the maleimide compound (a1) is, from the viewpoint of high heat resistance, low relative permittivity, high metal foil adhesion, high glass transition temperature, low thermal expansion, moldability and platability, preferably an aromatic hydrocarbon group-containing maleimide represented by any of the following general formulae (a1-1) to (a1-4), more preferably an aromatic hydrocarbon group-containing maleimide represented by the following general formula (a1-1), (a1-2) or (a1-4), even more preferably an aromatic hydrocarbon group-containing maleimide represented by the following general formula (a1-2).

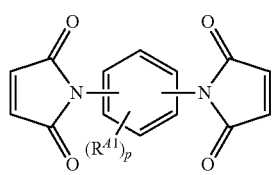
(a1-1)

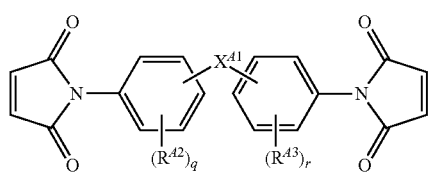
(a1-2)

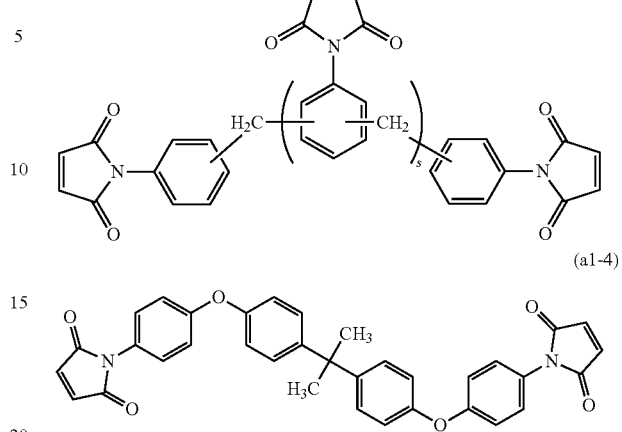
(a1-3)

(a1-4)

In the above formulae, $R^{41}$ to $R^{43}$ each independently represent an aliphatic hydrocarbon group having 1 to 5 carbon atoms. $X^{41}$ represents an alkylene group having 1 to 5 carbon atoms, an alkylidene group having 2 to 5 carbon atoms, —O—, —C(=O)—, —S—, —S—S— or a sulfonyl group. p, q and r each independently represent an integer of 0 to 4. s represents an integer of 0 to 10.

Examples of the aliphatic hydrocarbon group having 1 to 5 carbon atoms, as represented by $R^{41}$ to $R^{43}$, include a methyl group, an ethyl group, an n-propyl group, an isopropyl group, an n-butyl group, an isobutyl group, a t-butyl group, an n-pentyl group, etc. The aliphatic hydrocarbon group is, from the viewpoint of high heat resistance, low relative permittivity, high metal foil adhesion, high glass transition temperature, low thermal expansion, moldability and platability, preferably an aliphatic hydrocarbon group having 1 to 3 carbon atoms, more preferably a methyl group or an ethyl group.

Examples of the alkylene group having 1 to 5 carbon atoms, as represented by $X^{41}$, include a methylene group, a 1,2-dimethylene group, a 1,3-trimethylene group, a 1,4-tetramethylene group, a 1,5-pentamethylene group, etc. The alkylene group is, from the viewpoint of high heat resistance, low relative permittivity, high metal foil adhesion, high glass transition temperature, low thermal expansion, moldability and platability, preferably an alkylene group having 1 to 3 carbon atoms, more preferably a methylene group.

Examples of the alkylidene group having 2 to 5 carbon atoms, as represented by $X^{41}$, include an ethylidene group, a propylidene group, an isopropylidene group, a butylidene group, an isobutylidene group, a pentylidene group, an isopentylidene group, etc. Among these, from the viewpoint of high heat resistance, low relative permittivity, high metal foil adhesion, high glass transition temperature, low thermal expansion, moldability and platability, an isopropylidene group is preferred.

Among the above-mentioned choices, $X^{41}$ is preferably an alkylene group having 1 to 5 carbon atoms or an alkylidene group having 2 to 5 carbon atoms. More preferred ones are as mentioned above.

p, q and r each independently represent an integer of 0 to 4, and from the viewpoint of high heat resistance, low relative permittivity, high metal foil adhesion, high glass transition temperature, low thermal expansion, moldability and platability, preferably an integer of 0 to 2, more preferably 0 or 1, even more preferably 0.

s represents an integer of 0 to 10, and from the viewpoint of easy availability, preferably an integer of 0 to 5, more preferably an integer of 0 to 3. In particular, the aromatic hydrocarbon group-containing maleimide compound represented by the general formula (a1-3) is preferably a mixture where s is an integer of 0 to 3.

Specifically, examples of the maleimide compound (a1) include an aliphatic hydrocarbon group-containing maleimide such as N,N'-ethylenebismaleimide, N, N'-hexamethylenebismaleimide, bis(4-maleimidecyclohexyl)methane, 1,4-bis(maleimidemethyl)cyclohexane, etc.; and an aromatic hydrocarbon group-containing maleimide such as N,N'-(1,3-phenylene)bismaleimide, N,N'-[1,3-(2-methylphenylene)] bismaleimide, N,N'-[1,3-(4-methylphenylene)]bismaleimide, N,N'-(1,4-phenylene)bismaleimide, bis(4-maleimidephenyl)methane, bis(3-methyl-4-maleimidephenyl)methane, 3,3'-dimethyl-5,5'-diethyl-4,4'-diphenylmethanebismaleimide, bis(4-maleimidephenyl) ether, bis(4-maleimidephenyl) sulfone, bis(4-maleimidephenyl) sulfide, bis(4-maleimidephenyl) ketone, 1,4-bis(4-maleimidephenyl)cyclohexane, 1,4-bis(maleimidemethyl)cyclohexane, 1,3-bis(4-maleimidephenoxy)benzene, 1,3-bis(3-maleimidephenoxy)benzene, bis[4-(3-maleimidephenoxy)phenyl]methane, bis[4-(4-maleimidephenoxy)phenyl]methane, 1,1-bis[4-(3-maleimidephenoxy)phenyl]ethane, 1,1-bis[4-(4-maleimidephenoxy)phenyl]ethane, 1,2-bis[4-(3-maleimidephenoxy)phenyl]ethane, 1,2-bis[4-(4-maleimidephenoxy)phenyl]ethane, 2,2-bis[4-(3-maleimidephenoxy)phenyl]propane, 2,2-bis[4-(4-maleimidephenoxy)phenyl]propane, 2,2-bis[4-(3-maleimidephenoxy)phenyl]butane, 2,2-bis[4-(4-maleimidephenoxy)phenyl]butane, 2,2-bis[4-(3-maleimidephenoxy)phenyl]-1,1,1,3,3,3-hexafluoropropane, 2,2-bis[4-(4-maleimidephenoxy)phenyl]-1,1,1,3,3,3-hexafluoropropane, 4,4-bis(3-maleimidephenoxy)biphenyl, 4,4-bis(4-maleimidephenoxy)biphenyl, bis[4-(3-maleimidephenoxy)phenyl] ketone, bis[4-(4-maleimidephenoxy)phenyl] ketone, 2,2'-bis(4-maleimidephenyl) disulfide, bis(4-maleimidephenyl) disulfide, bis[4-(3-maleimidephenoxy) phenyl] sulfide, bis[4-(4-maleimidephenoxy)phenyl] sulfide, bis[4-(3-maleimidephenoxy)phenyl] sulfoxide, bis [4-(4-maleimidephenoxy)phenyl] sulfoxide, bis[4-(3-maleimidephenoxy)phenyl] sulfone, bis[4-(4-maleimidephenoxy)phenyl] sulfone, bis[4-(3-maleimidephenoxy)phenyl] ether, bis[4-(4-maleimidephenoxy)phenyl] ether, 1,4-bis[4-(4-maleimidephenoxy)-α,α-dimethylbenzyl]benzene, 1,3-bis[4-(4-maleimidephenoxy)-α,α-dimethylbenzyl]benzene, 1,4-bis[4-(3-maleimidephenoxy)-α,α-dimethylbenzyl]benzene, 1,3-bis[4-(3-maleimidephenoxy)-α,α-dimethylbenzyl]benzene, 1,4-bis[4-(4-maleimidephenoxy)-3,5-dimethyl-α,α-dimethylbenzyl]benzene, 1,3-bis[4-(4-maleimidephenoxy)-3,5-dimethyl-α,α-dimethylbenzyl] benzene, 1,4-bis[4-(3-maleimidephenoxy)-3,5-dimethyl-α,α-dimethylbenzyl]benzene, 1,3-bis[4-(3-maleimidephenoxy)-3,5-dimethyl-α,α-dimethylbenzyl] benzene, polyphenylmethanemaleimide, etc.

Among these, from the viewpoint of high reactivity and advanced heat resistance, bis(4-maleimidephenyl)methane, bis(4-maleimidephenyl) sulfone, bis(4-maleimidephenyl) sulfide, bis(4-maleimidephenyl) disulfide, N,N'-(1,3-phenylene)bismaleimide and 2,2-bis[4-(4-maleimidephenoxy) phenyl]propane are preferred, from the viewpoint of inexpensiveness, bis(4-maleimidephenyl)methane and N,N'-(1, 3-phenylene)bismaleimide are preferred, and from the viewpoint of solubility in organic solvent, bis(4-maleimidephenyl)methane is especially preferred.

One of the maleimide compounds (a1) may be used singly or two or more thereof may be used in combination.

(Monoamine Compound (a2))

The monoamine compound (a2) is a monoamine compound having an acidic substituent (for example, a hydroxy group, a carboxy group, a sulfonic acid group, etc.), preferably an aromatic monoamine compound having an acidic substituent, more preferably a monoamine compound represented by the following general formula (a2-1).

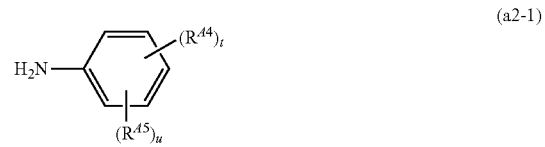

(a2-1)

In the general formula (a2-1), $R^{44}$ represents an acidic substituent selected from a hydroxy group, a carboxy group and a sulfonic acid group, $R^{45}$ represents an alkyl group having 1 to 5 carbon atoms, or a halogen atom, t represents an integer of 1 to 5, u represents an integer of 0 to 4, and t and u satisfy $1 \leq t+u \leq 5$, provided that when t is an integer of 2 to 5, plural $R^{44}$'s may be the same or different, and when u is an integer of 2 to 4, plural $R^{45}$'s may be the same or different.

The acidic substituent represented by $R^{44}$ is, from the viewpoint of solubility and reactivity, preferably a hydroxy group or a carboxy group, and is, also in consideration of heat resistance, more preferably a hydroxy group.

t represents an integer of 1 to 5, and is, from the viewpoint of high heat resistance, low relative permittivity, high metal foil adhesion, high glass transition temperature, low thermal expansion, moldability and platability, preferably an integer of 1 to 3, more preferably 1 or 2, even more preferably 1.

Examples of the alkyl group having 1 to 5 carbon atoms, as represented by $R^{45}$, include a methyl group, an ethyl group, an n-propyl group, an isopropyl group, an n-butyl group, an isobutyl group, a t-butyl group, an n-pentyl group, etc. The alkyl group is preferably an alkyl group having 1 to 3 carbon atoms.

The halogen atom represented by $R^{45}$ includes a fluorine atom, a chlorine atom, a bromine atom, an iodine atom, etc.

u represents an integer of 0 to 4, and is, from the viewpoint of high heat resistance, low relative permittivity, high metal foil adhesion, high glass transition temperature, low thermal expansion, moldability and platability, preferably an integer of 0 to 3, more preferably an integer of 0 to 2, even more preferably 0 or 1, especially preferably 0.

The monoamine compound (a2) is, from the viewpoint of high heat resistance, low relative permittivity, high metal foil adhesion, high glass transition temperature, low thermal expansion, moldability and platability, more preferably a monoamine compound represented by the following general formula (a2-2) or (a2-3), even more preferably a monoamine compound represented by the following general formula (a2-2). $R^{44}$, $R^{45}$ and u in the general formulae (a2-2) and (a2-3) are the same as those in the general formula (a2-1), and preferred examples thereof are also the same as the latter.

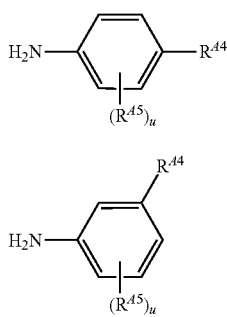

(a2-2)

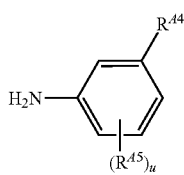

(a2-3)

Examples of the monoamine compound (a2) include a monoamine compound having an acidic substituent, such as o-aminophenol, m-aminophenol, p-aminophenol, o-aminobenzoic acid, m-aminobenzoic acid, p-aminobenzoic acid, o-aminobenzenesulfonic acid, m-aminobenzenesulfonic acid, p-aminobenzenesulfonic acid, 3,5-dihydroxyaniline, 3,5-dicarboxyaniline, etc.

Among these, from the viewpoint of solubility and reactivity, m-aminophenol, p-aminophenol, p-aminobenzoic acid and 3,5-dihydroxyaniline are preferred, and from the viewpoint of heat resistance, o-aminophenol, m-aminophenol and p-aminophenol are preferred, and also in consideration of dielectric characteristics, low thermal expansion and production cost, p-aminophenol is more preferred.

One of the monoamine compounds (a2) may be used singly or two or more thereof may be used in combination.
(Diamine Compounds (a3))

The diamine compound (a3) is a compound having two amino groups in one molecule. The diamine compound is an important compound from the viewpoint of greatly enhancing the advantageous effects of the present invention, especially platability. From the same viewpoint, the diamine compound (a3) is preferably a compound having two primary amino groups in one molecule, more preferably an aromatic diamine compound having two primary amino groups in one molecule, even more preferably a diamine compound represented by the following general formula (a3-1).

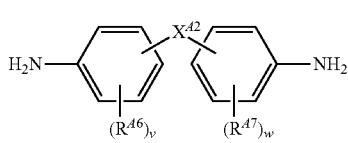

(a3-1)

In the formula, $X^{A2}$ represents an aliphatic hydrocarbon group having 1 to 3 carbon atoms, or —O—, $R^{A6}$ and $R^{A7}$ each independently represent an alkyl group having 1 to 5 carbon atoms, a halogen atom, a hydroxy group, a carboxy group or a sulfonic acid group, and v and w each independently represent an integer of 0 to 4.

Examples of the aliphatic hydrocarbon group having 1 to 3 carbon atoms, as represented by $X^{A2}$, include a methylene group, an ethylene group, a propylene group, a propylidene group, etc.

$X^{A2}$ is preferably a methylene group.

Examples of the alkyl group having 1 to 5 carbon atoms, as represented by $R^{A6}$ and $R^{A7}$, include a methyl group, an ethyl group, an n-propyl group, an isopropyl group, an n-butyl group, an isobutyl group, a t-butyl group, an n-pentyl group, etc. The alkyl group is preferably an alkyl group having 1 to 3 carbon atoms.

v and w each are preferably an integer of 0 to 2, more preferably 0 or 1, even more preferably 0.

Specifically, examples of the diamine compound (a3) include 4,4'-diaminodiphenylmethane, 4,4'-diaminodiphenylethane, 4,4'-diaminodiphenylpropane, 2,2'-bis[4,4'-diaminodiphenyl]propane, 3,3'-dimethyl-4,4,'-diaminodiphenylmethane, 3,3'-diethyl-4,4'-diaminodiphenylmethane, 3,3'-dimethyl-4,4'-diaminodiphenylethane, 3,3'-diethyl-4,4'-diaminodiphenylethane, 4,4'-diaminodiphenyl ether, 4,4'-diaminodiphenyl thioether, 3,3'-dihydroxy-4,4'-diaminodiphenylmethane, 2,2',6,6'-tetramethyl-4,4'-diaminodiphenylmethane, 3,3'-dichloro-4,4'-diaminodiphenylmethane, 3,3'-dibromo-4,4'-diaminodiphenylmethane, 2,2',6,6'-tetramethylchloro-4,4'-diaminodiphenylmethane, 2,2',6,6'-tetrabromo-4,4'-diaminodiphenylmethane, etc. Among these, from the viewpoint of inexpensiveness, 4,4'-diaminodiphenylmethane and 3,3'-diethyl-4,4'-diaminodiphenylmethane are preferred, and from the viewpoint of solubility in solvent, 4,4'-diaminodiphenylmethane is more preferred.

Preferably, the maleimide compound (a1), the monoamine compound (a2) and the diamine compound (a3) are reacted, for example, in the presence of an organic solvent at a reaction temperature of 70 to 200° C. for 0.1 to 10 hours.

The reaction temperature is more preferably 70 to 160° C., even more preferably 70 to 130° C., especially preferably 80 to 120° C.

The reaction time is more preferably 1 to 6 hours, even more preferably 1 to 4 hours.
(Amount Used of Maleimide Compound (a1), Monoamine Compound (a2) and Diamine Compound (a3))

In the reaction of the maleimide compound (a1), the monoamine compound (a2) and the diamine compound (a3), the amount of the three to be used preferably satisfies the following expression that indicates the relationship between the sum total of the equivalent amount of the primary amino group that the monoamine compound (a2) and the diamine compound (a3) have [expressed as —NH$_2$ group equivalent] and the maleimide group equivalent of the maleimide compound (a1), from the viewpoint of greatly enhancing the advantageous effects of the present invention, especially platability.

0.1≤[maleimide group equivalent]/[sum total of —NH$_2$ group equivalent]≤10

By defining [maleimide group equivalent]/[sum total of —NH$_2$ group equivalent] to be 0.1 or more, gelation and heat resistance reduction could be prevented, and by defining the ratio to be 10 or less, reduction in solubility in organic solvent, metal foil adhesion and heat resistance could be prevented.

From the same viewpoints, more preferably, the ratio satisfies:

1≤[maleimide group equivalent]/[sum total of —NH$_2$ group equivalent]≤9, even more preferably, 2≤[maleimide group equivalent]/[sum total of —NH$_2$ group equivalent]≤8.

(Organic Solvent)

As described above, preferably, the maleimide compound (a1), the monoamine compound (a2) and the diamine compound (a3) are reacted preferably in an organic solvent.

The organic solvent is not specifically limited so far as it does not have any negative influence on the reaction, and examples thereof include alcohol solvents such as ethanol, propanol, butanol, methyl cellosolve, butyl cellosolve, propylene glycol monomethyl ether, etc.; ketone solvents such as acetone, methyl ethyl ketone, methyl isobutyl ketone, cyclohexanone, etc.; ether solvents such as tetrahydrofuran, etc.; aromatic solvents such as toluene, xylene, mesitylene, etc.; nitrogen atom-containing solvents including amide solvents such as dimethylformamide, dimethylacetamide, N-methylpyrrolidone, etc.; sulfur atom-containing solvents including sulfoxide solvents such as dimethyl sulfoxide, etc.; ester solvents such as ethyl acetate, γ-butyrolactone, etc. Among these, from the viewpoint of solubility, alcohol solvents, ketone solvents and ester solvents are preferred, and from the viewpoint of low toxicity, cyclohexanone, propylene glycol monomethyl ether, methyl cellosolve, and y-butyrolactone are more preferred, and also in consideration of the fact that the solvent is highly volatile and could hardly remain as a residual solvent in prepreg production, cyclohexanone, propylene glycol monomethyl ether and dimethylacetamide are more preferred, and dimethylacetamide is especially preferred.

One of the organic solvents may be used singly or two or more thereof may be used in combination.

The amount of the organic solvent to be used is not specifically limited, but from the viewpoint of solubility and reaction efficiency, the amount is preferably 25 to 1,000 parts by mass relative to 100 parts by mass of the total of the maleimide compound (a1), the monoamine compound (a2) and the diamine compound (a3), more preferably 40 to 700 parts by mass, and further preferably 60 to 250 parts by mass. By limiting the amount of the organic solvent used to 25 parts by mass or more relative to 100 parts by mass of the total of the maleimide compound (a1), the monoamine compound (a2) and the diamine compound (a3), solubility can be readily secured, and by limiting to 1,000 parts by mass or less, significant reduction in reaction efficiency is easy to prevent.

(Reaction Catalyst)

The maleimide compound (a1), the monoamine compound (a2) and the diamine compound (a3) can be reacted optionally in the presence of a reaction catalyst. Examples of the reaction catalyst include amine catalysts such as triethylamine, pyridine, tributylamine, etc.; imidazole catalysts such as methylimidazole, phenylimidazole, etc.; phosphorus-containing catalysts such as triphenyl phosphine, etc.

One of the reaction catalysts may be used singly or two or more thereof may be used in combination.

The amount of the reaction catalyst to be used is not specifically limited, but is preferably 0.001 to 5 parts by mass relative to 100 parts by mass of the sum total by mass of the maleimide compound (a1) and the monoamine compound (a2).

<(B) Epoxy Resin>

The component (B) is an epoxy resin (hereinafter this may be referred to as an epoxy resin (B)), and is preferably an epoxy resin having at least two epoxy groups in one molecule.

The epoxy resin having at least two epoxy groups in one molecule includes glycidyl ether-type epoxy resins, glycidylamine-type epoxy resins, glycidyl ester-type epoxy resins, etc. Among these, glycidyl ether-type epoxy resins are preferred.

The epoxy resin (B) can be classified into various kinds of epoxy resins depending on the difference in the main skeleton. The epoxy resins of the above-mentioned types can be further grouped into bisphenol-type epoxy resins such as bisphenol A-type epoxy resins, bisphenol F-type epoxy resins, bisphenol S-type epoxy resins, etc.; biphenylaralkylphenol-type epoxy resins; novolak-type epoxy resins such as phenol-novolak-type epoxy resins, alkylphenol-novolak-type epoxy resins, cresol-novolak-type epoxy resins, naphtholalkylphenol-copolymerized novolak-type epoxy resins, naphtholaralkylcresol-copolymerized novolak-type epoxy resins, bisphenol A-novolak-type epoxy resins, bisphenol F-novolak-type epoxy resins, etc.; stilbene-type epoxy resins; triazine skeleton-containing epoxy resins; fluorene skeleton-containing epoxy resins; naphthalene-type epoxy resins; anthracene-type epoxy resins; triphenylmethane-type epoxy resins; biphenyl-type epoxy resins; biphenylaralkyl-type epoxy resins; xylylene-type epoxy resins; alicyclic epoxy resins such as dicyclopentadiene-type epoxy resins, etc.

Among these, from the viewpoint of high heat resistance, low relative permittivity, high metal foil adhesion, high glass transition temperature, low thermal expansion, moldability and platability, bisphenol F-type epoxy resins, phenol-novolak-type epoxy resins, cresol-novolak-type epoxy resins, naphthalene-type epoxy resins, anthracene-type epoxy resins, biphenyl-type epoxy resins, biphenylaralkyl-type epoxy resins and dicyclopentadiene-type epoxy resins are preferred, and from the viewpoint of low thermal expansion and high glass transition temperature, cresol-novolak-type epoxy resins, naphthalene-type epoxy resins, anthracene-type epoxy resins, biphenyl-type epoxy resins, biphenylaralkyl-type epoxy resins, and phenol-novolak-type epoxy resins are more preferred, and cresol-novolak-type epoxy resins are even more preferred.

One of the epoxy resins (B) may be used singly or two or more thereof may be used in combination.

The epoxy equivalent of the epoxy resin (B) is preferably 100 to 500 g/eq, more preferably 120 to 400 g/eq, even more preferably 140 to 300 g/eq, especially preferably 170 to 240 g/eq.

Here, the epoxy equivalent is a mass of resin per epoxy group (g/eq), and can be measured according to the method defined in JIS K 7236 (2001). Specifically, using an automatic titrator manufactured by Mitsubishi Chemical Analytech Co., Ltd. "GT-200 Model", 2 g of an epoxy resin is metered in a 200-ml beaker, 90 ml of methyl ethyl ketone is dropwise added thereto to dissolve the epoxy resin therein with an ultrasonic washer, and 10 ml of glacial acetic acid and 1.5 g of cetyltrimethylammonium bromide are added, and the resultant solution is titrated with a solution of 0.1 mol/L perchloric acid/acetic acid to thereby determine the epoxy equivalent of the resin.

Commercial products of the epoxy resin (B) include a cresol-novolak-type epoxy resin "EPICLON (registered trademark) N-673" (manufactured by DIC Corporation, epoxy equivalent: 205 to 215 g/eq), a naphthalene-type epoxy resin "HP-4032" (manufactured by Mitsubishi Chemical Corporation, epoxy equivalent: 152 g/eq), a biphenyl-type epoxy resin "YX-4000" (manufactured by Mitsubishi Chemical Corporation, epoxy equivalent: 186 g/eq), a dicyclopentadiene-type epoxy resin "HP-7200H" (manufactured by DIC Corporation, epoxy equivalent: 280 g/eq), etc. The epoxy equivalent is a value described in the catalogue of the product distributed by the manufacturer.

<(C) Specific Copolymer Resin>

The component (C) is a copolymer resin having a structural unit derived from an aromatic vinyl compound and a structural unit derived from a maleic anhydride (hereinafter this may be referred to as a copolymer resin (C)). Examples of the aromatic vinyl compound include styrene, 1-methylstyrene, vinyltoluene, dimethylstyrene, etc. Among these, styrene is preferred.

The component (C) is preferably a copolymer resin having a structural unit represented by the following general formula (C-i) and a structural unit represented by the following formula (C-ii).

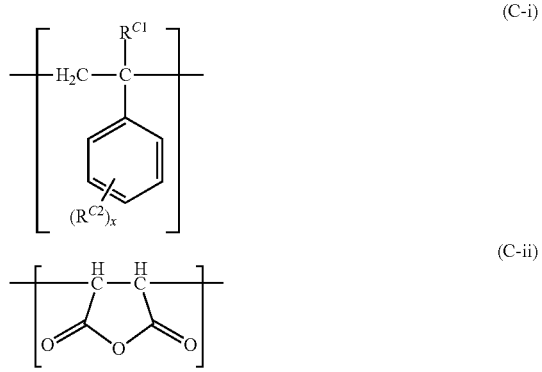

In the formulae, $R^{C1}$ represents a hydrogen atom, or an alkyl group having 1 to 5 carbon atoms, $R^{C2}$ represents an alkyl group having 1 to 5 carbon atoms, an alkenyl group having 2 to 5 carbon atoms, an aryl group having 6 to 20 carbon atoms, a hydroxy group, or a (meth)acryloyl group, x represents an integer of 0 to 3, provided that when x is 2 or 3, plural $R^{C2}$'s may be the same or different.

Examples of the alkyl group having 1 to 5 carbon atoms, as represented by $R^{C1}$ and $R^{C2}$ include a methyl group, an ethyl group, an n-propyl group, an isopropyl group, an n-butyl group, an isobutyl group, a t-butyl group, an n-pentyl group, etc. The alkyl group is preferably an alkyl group having 1 to 3 carbon atoms.

Examples of the alkenyl group having 2 to 5 carbon atoms, as represented by $R^{C2}$ include an allyl group, a crotyl group, etc. The alkenyl group is preferably an alkenyl group having 3 to 5 carbon atoms, more preferably an alkenyl group having 3 or 4 carbon atoms.

The aryl group having 6 to 20 carbon atoms, as represented by $R^{C2}$, include a phenyl group, a naphthyl group, an anthryl group, a biphenylyl group, etc. The aryl group is preferably an aryl group having 6 to 12 carbon atoms, more preferably an aryl group having 6 to 10 carbon atoms.

x is preferably 0 or 1, more preferably 0.

The structural unit represented by the general formula (C-i) is preferably a structural unit represented by the following general formula (C-i-1) where $R^{C1}$ is a hydrogen atom and x is 0, that is, a structural unit derived from styrene.

The content ratio of the structural unit derived from an aromatic vinyl compound to the structural unit derived from a maleic anhydride [aromatic vinyl compound-derived structural unit/maleic anhydride-derived structural unit] (molar ratio) in the copolymer resin (C) is preferably 1 to 9, more preferably 2 to 9, even more preferably 3 to 8, especially preferably 3 to 7. Similarly, the content ratio of the structural unit represented by the formula (C-i) to the structural unit represented by the formula (C-ii) [(C-i)/(C-ii)] (molar ratio) is preferably 1 to 9, more preferably 2 to 9, even more preferably 3 to 8, especially preferably 3 to 7. When the molar ratio is 1 or more, preferably 2 or more, the effect of improving dielectric characteristics tends to be sufficient, and when 9 or less, miscibility tends to better.

In the copolymer resin (C), the total content of the structural unit derived from an aromatic vinyl compound and the structural unit derived from a maleic anhydride, and the total content of the structural unit represented by the general formula (C-i) and the structural unit represented by the formula (C-ii) each are preferably 50% by mass or more, more preferably 70% by mass or more, even more preferably 90% by mass or more, especially preferably substantially 100% by mass.

The weight average molecular weight (Mw) of the copolymer resin (C) is preferably 4,500 to 18,000, more preferably 5,000 to 18,000, even more preferably 6,000 to 17,000, still more preferably 8,000 to 16,000, further more preferably 8,000 to 15,000, and most preferably 9,000 to 13,000.

When the method of lowering the dielectric constant of an epoxy resin by the use of a copolymer resin of styrene and maleic anhydride is applied to a material for printed wiring board, the penetrability into substrate and the copper foil peel strength often becomes insufficient, and therefore, in general, using the method tends to be evaded. Consequently, using the copolymer resin (C) also tends to be evaded. However, the present inventors have found that, though using the copolymer resin (C), a thermosetting resin composition containing the component (A) and the component (B) and having high heat resistance, low relative permittivity, high metal foil adhesion, high glass transition temperature and low thermal expansion and excellent in moldability and platability can be obtained, and on the basis of this finding, the inventors have achieved the present invention.
(Production Method for Copolymer Resin (C))

The copolymer resin (C) can be produced by copolymerizing an aromatic vinyl compound and a maleic anhydride.

The aromatic vinyl compound includes, as described above, styrene, 1-methylstyrene, vinyltoluene, dimethylstyrene, etc. One of them may be used singly or two or more thereof may be used in combination.

Further, in addition to the aromatic vinyl compound and the maleic anhydride, any other various polymerizable components may be copolymerized. Examples of the other various polymerizable components include vinyl compounds such as ethylene, propylene, butadiene, isobutylene, acrylonitrile, etc.; (meth)acryloyl group-having compounds such as methyl acrylate, methyl methacrylate, etc.

A substituent such as an allyl group, a methacryloyl group, an acryloyl group, a hydroxy group or the like may be introduced into the aromatic vinyl compound through Friedel-Crafts reaction or reaction using a metal catalyst such as lithium or the like.

Commercial products can be used for the copolymer resin (C). Examples of the commercial products include "SMA (registered trademark) 1000" (styrene/maleic anhydride=1, Mw=5,000), "SMA (registered trademark) EF30" (styrene/maleic anhydride=3, Mw=9,500), "SMA (registered trademark) EF40" (styrene/maleic anhydride=4, Mw=11,000), "SMA (registered trademark) EF60" (styrene/maleic anhydride=6, Mw=11,500), "SMA (registered trademark) EF80"

(styrene/maleic anhydride=8, Mw=14,400) (all manufactured by CRAY VALLEY Inc.), etc.

<(D) Silica Treated with Aminosilane Coupling Agent>

An inorganic filler is added to a thermosetting resin composition for the purpose of lowering the thermal expansion rate of the insulating resin layer, but in the present invention, a silica treated with an aminosilane coupling agent of silicas (hereinafter this may be referred to as a silica (D) treated with an aminosilane coupling agent) is used as the component (D). Adding the silica (D) treated with an aminosilane coupling agent to the thermosetting resin composition provides an effect of securing low expansion and good platability and, in addition thereto, also provides an effect of improving adhesion of silica to the components (A) to (C), thereby preventing silica from dropping off, and as a result, there can be obtained an effect of preventing deformation of laser vias owing to excessive desmearing.

Specifically, the aminosilane coupling agent is preferably a silane coupling agent having a silicon-containing group represented by the following general formula (D-1), and an amino group.

(D-1)

In the formula, $R^{D1}$ represents an alkyl group having 1 to 3 carbon atoms, or an acyl group having 2 to 4 carbon atoms, and y represents an integer of 0 to 3.

The alkyl group having 1 to 3 carbon atoms, as represented by $R^{D1}$, includes a methyl group, an ethyl group, an n-propyl group, an isopropyl group. Among these, a methyl group is preferred.

The acyl group having 2 to 4 carbon atoms, as represented by $R^{D1}$, includes an acetyl group, a propionyl group, an acryl group. Among these, an acetyl group is preferred.

The aminosilane coupling agent may have one amino group, or may have two amino groups, or 3 or more amino groups. In general, the agent has one or two amino groups.

Examples of the aminosilane coupling agent having one amino group include, though not specifically limited thereto, 3-aminopropyltrimethoxysilane, 3-aminopropyltriethoxysilane, N-phenyl-3-aminopropyltrimethoxysilane, N-phenyl-3-aminopropyltriethoxysilane, 3-triethoxysilyl-N-(1,3-dimethyl-butylidene)propylamine, 2-propynyl[3-(trimethoxysilyl)propyl] carbamate, etc.

Examples of the aminosilane coupling agent having two amino groups include, though not specifically limited thereto, N-2-(aminoethyl)-3-aminopropylmethyldimethoxysilane, N-2-(aminoethyl)-3-aminopropyltrimethoxysilane, 1-[3-(trimethoxysilyl)propyl]urea, 1-[3-(triethoxysilyl)propyl]urea, etc.

In place of the silica (D) treated with an aminosilane coupling agent, when a silica treated with, for example, an epoxysilane coupling agent, a phenylsilane coupling agent, an alkylsilane coupling agent, an alkenylsilane coupling agent, an alkynylsilane coupling agent, a haloalkylsilane coupling agent, a siloxane coupling agent, a hydrosilane coupling agent, a silazane coupling agent, an alkoxysilane coupling agent, a chlorosilane coupling agent, a (meth) acrylsilane coupling agent, an isocyanurate silane coupling agent, an ureidosilane coupling agent, a mercaptosilane coupling agent, a sulfide silane coupling agent, an isocyanate silane coupling agent or the like is used, the adhesion thereof to the above-mentioned components (A) to (C) lowers and the silica tends to often drop off to lower the effect of preventing deformation of laser vias owing to excessive desmearing.

So far as the silica (D) treated with an aminosilane coupling agent is used, an additional silica treated with any other coupling agent as mentioned above may also be used within a range not detracting from the advantageous effects of the present invention. In the case where the silica treated with any other coupling agent as mentioned above is additionally used, the amount of the silica treated with some other coupling agent to be used is preferably 50 parts by mass or less relative to 100 parts by mass of the silica (D) treated with an aminosilane coupling agent, more preferably 30 parts by mass or less, further preferably 15 parts by mass or less, particularly preferably 10 parts by mass or less, and most preferably 5 parts by mass or less.

Examples of the silica for use for the silica (D) treated with an aminosilane coupling agent include a precipitated silica produced according to a wet process and having a high water content, and dry-process silica produced according to a dry process and containing little bound water, etc. The dry-process silica includes a crushed silica, a fumed silica, a molten silica (molten spherical silica), etc., as grouped depending on the production method. The silica is preferably a molten silica from the viewpoint of low thermal expansion and high flowability in charging in resin.

The mean particle size of the silica is not specifically limited but is preferably 0.1 to 10 μm, more preferably 0.1 to 6 μm, even more preferably 0.1 to 3 μm, especially preferably 1 to 3 μm. When the mean particle size of the silica is defined to be 0.1 μm or more, good flowability in high charging can be secured, and when defined to be 10 μm or less, the probability of mixing with coarse particles can be reduced and occurrence of failure owing to coarse particles can be reduced. Here, the mean particle size is a particle size at a point corresponding to just 50% volume on a cumulative frequency distribution curve of particle size drawn with the total volume of particles as 100%, and can be measured using a particle sizer or the like according to a laser diffraction scattering method.

The specific surface area of the silica is preferably 4 m²/g or more, more preferably 4 to 9 m²/g, even more preferably 5 to 7 m²/g.

<(E) Curing Agent>

The thermosetting resin composition may further contain a curing agent as a component (E) (hereinafter this may be referred to as a curing agent (E)). The curing agent (E) includes dicyandiamide; linear aliphatic amines except dicyandiamide, such as ethylenediamine, diethylenetriamine, triethylenetetramine, tetraethylenepentamine, hexamethylenediamine, diethylaminopropylamine, tetramethylguanidine, triethanolamine, etc.; cyclic aliphatic amines such as isophoronediamine, diaminodicyclohexylmethane, bis(aminomethyl)cyclohexane, bis(4-amino-3-methyldicyclohexyl)methane, N-aminoethylpiperazine, 3,9-bis(3-aminopropyl)-2,4,8,10-tetroxaspiro[5.5]undecane, etc.; aromatic amines such as xylenediamine, phenylenediamine, diaminodiphenylmethane, diaminodiphenyl sulfone, etc. Among these, dicyandiamide is preferred from the viewpoint of metal foil adhesion and low thermal expansion.

The dicyandiamide is represented by $H_2N-C(=NH)-NH-CN$, and the melting point thereof is generally 205 to 215° C., but the melting point thereof having a higher purity is 207 to 212° C. The dicyandiamide is a crystalline substance, and may be a rhombic crystal or may be a tabular crystal. The dicyandiamide is preferably one having a purity of 98% or more, more preferably a purity of 99% or more, even more preferably a purity of 99.4% or more. Commercial products may be used as the dicyandiamide, and, for example, those manufactured by Nippon Carbide Industries Co., Ltd., Tokyo Chemical Industry Co., Ltd., Kishida Chemical Co., Ltd., Nacalai Tesque Inc., etc.

<(F) Flame Retardant>

The thermosetting resin composition may further contain a flame retardant (hereinafter this may be referred to as a flame retardant (F)) as a component (F). Here, dicyandiamide and the like among the above-mentioned curing agent may also have an effect as a flame retardant, but in the present invention, those capable of functioning as a curing agent are grouped in the curing agent and are excluded from the component (F).

Examples of the flame retardant include a halogen-containing flame retardant containing bromine, chlorine or the like; a phosphorus-containing flame retardant; a nitrogen-containing flame retardant such as guanidine sulfamate, melamine sulfate, melamine polyphosphate, melamine cyanurate, etc.; phosphazene-type flame retardants such as cyclophosphazene, polyphosphazene, etc.; inorganic flame retardants such as antimony trioxide, etc. Among these, a phosphorus-containing flame retardant is preferred.

The phosphorus-containing flame retardant includes an inorganic phosphorus-containing flame retardant and an organic phosphorus-containing flame retardant.

Examples of the inorganic phosphorus-containing flame retardant include red phosphorus; ammonium phosphates such as monoammonium phosphate, diammonium phosphate, triammonium phosphate, ammonium polyphosphate, etc.; inorganic nitrogen-containing phosphorus compounds such as phosphoric acid amide, etc.; phosphoric acid; phosphine oxide, etc.

Examples of the organic phosphorus-containing flame retardant include aromatic phosphates, monosubstituted phosphonic acid diesters, disubstituted phosphinic acid esters, metal salts of disubstituted phosphinic acids, organic nitrogen-containing phosphorus compounds, cyclic organic phosphorus compounds, phosphorus-containing phenolic resins, etc. Among these, aromatic phosphates, and metal salts of disubstituted phosphinic acids are preferred. Here, the metal salt is preferably any of lithium salts, sodium salts, potassium salts, calcium salts, magnesium salts, aluminum salts, titanium salts, and zinc salts, and aluminum salts are more preferred. Among the organic phosphorus-containing flame retardants, aromatic phosphates are more preferred.

Examples of the aromatic phosphate include triphenyl phosphate, tricresyl phosphate, trixylenyl phosphate, cresyldiphenyl phosphate, cresyl-di-2,6-xylenyl phosphate, resorcinol bis(diphenyl phosphate), 1,3-phenylenebis(di-2,6-xylenyl phosphate), bisphenol A-bis(diphenyl phosphate), 1,3-phenylenebis(diphenyl phosphate), etc.

Examples of the monosubstituted phosphonic acid ester include divinyl phenylphosphonate, diallyl phenylphosphonate, bis(1-butenyl) phenylphosphonate, etc.

Examples of the disubstituted phosphinic acid ester include phenyl diphenylphosphinate, methyl diphenylphosphinate, etc.

Examples of the metal salt of a disubstituted phosphinic acid include metal salts of dialkylphosphinic acids, metal salts of diallylphosphinic acids, metal salts of divinylphosphinic acids, metal salts of diarylphosphinic acids, etc. These metal salts are, as mentioned above, preferably any of a lithium salt, a sodium salt, a potassium salt, a calcium salt, a magnesium salt, an aluminum salt, a titanium salt or a zinc salt is more preferred.

Examples of the organic nitrogen-containing phosphorus compound include phosphazene compounds such as bis(2-allylphenoxy)phosphazene, dicresylphosphazene, etc.; melamine phosphate, melamine pyrophosphate, melamine polyphosphate, melam polyphosphate, etc.

Examples of the cyclic organic phosphorus compound include 9,10-dihydro-9-oxa-10-phosphaphenanthrene-10-oxide, 10-(2,5-dihydroxyphenyl)-9,10-dihydro-9-oxa-10-phosphaphenanthrene-10-oxide, etc.

Among these, at least one selected from aromatic phosphates, metal salts of a di-substituted phosphinic acid, and cyclic organic phosphorus compounds is preferred, and aromatic phosphates are more preferred.

The aromatic phosphate is preferably an aromatic phosphate represented by the following general formula (F-1) or (F-2), and the metal salt of a disubstituted phosphinic acid is preferably a metal salt of a disubstituted phosphinic acid represented by the following general formula (F-3).

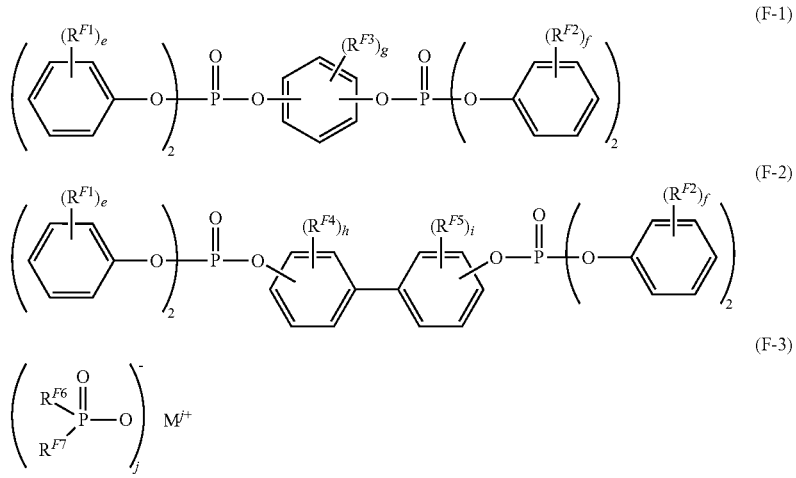

In the formulae, $R^{F1}$ to $R^{F5}$ each independently represent an alkyl group having 1 to 5 carbon atoms, or a halogen atom, e and f each independently represent an integer of 0 to 5, and g, h and i each independently represent an integer of 0 to 4.

$R^{F6}$ and $R^{F7}$ each independently represent an alkyl group having 1 to 5 carbon atoms, or an aryl group having 6 to 14 carbon atoms, M represents a lithium atom, a sodium atom, a potassium atom, a calcium atom, a magnesium atom, an aluminum atom, a titanium atom or a zinc atom, and j represents an integer of 1 to 4.

Examples of the alkyl group having 1 to 5 carbon atoms, as represented by $R^{F1}$ to $R^{F5}$, include a methyl group, an ethyl group, an n-propyl group, an isopropyl group, an n-butyl group, an isobutyl group, a t-butyl group, an n-pentyl group, etc. The alkyl group is preferably an alkyl group having 1 to 3 carbon atoms. Examples of the halogen atom represented by $R^{F1}$ to $R^{F5}$ include a fluorine atom, etc.

e and f are preferably an integer of 0 to 2, more preferably 2. g, h and i are preferably an integer of 0 to 2, more preferably 0 or 1, even more preferably 0.

The alkyl group having 1 to 5 carbon atoms, as represented by $R^{F6}$ and $R^{F7}$, includes the same as those of $R^{F1}$ to $R^{F5}$.

Examples of the aryl group having 6 to 14 carbon atoms, as represented by $R^{F6}$ and $R^{F7}$, include a phenyl group, a naphthyl group, a biphenylyl group, an anthryl group, etc. The aromatic hydrocarbon group is preferably an aryl group having 6 to 10 carbon atoms.

j is the same as the valence of the metal ion, that is, j varies within a range of 1 to 4 depending on the kind of M.

M is preferably an aluminum atom. In the case where M is an aluminum atom, j is 3.

(Content of Each Component)

In the thermosetting resin composition, the content of the components (A) to (D) is not specifically limited, but preferably, the component (A) accounts for 15 to 65 parts by mass relative to 100 parts by mass of the sum total of the components (A) to (C), the component (B) accounts for 15 to 50 parts by mass, the component (C) accounts for 10 to 45 parts by mass and the component (D) accounts for 30 to 70 parts by mass.

When the component (A) accounts for 15 parts by mass or more relative to 100 parts by mass of the sum total of the components (A) to (C), the composition tends to secure high heat resistance, low relative permittivity, high glass transition temperature, low thermal expansion and good platability. On the other hand, when 65 parts by mass or less, the thermosetting resin composition tends to have good flowability and moldability.

When the component (B) accounts for 15 parts by mass or more relative to 100 parts by mass of the sum total of the components (A) to (C), the composition tends to secure high heat resistance, high glass transition temperature and low thermal expansion. On the other hand, when 50 parts by mass or less, the thermosetting resin composition tends to secure high heat resistance, low relative permittivity, high glass transition temperature and low thermal expansion.

When the component (C) accounts for 10 parts by mass or more relative to 100 parts by mass of the sum total of the components (A) to (C), the composition tends to secure high heat resistance and low relative permittivity. On the other hand, when 45 parts by mass or less, the composition tends to secure high heat resistance, high metal foil adhesion and low thermal expansion.

When the component (D) accounts for 30 parts by mass or more relative to 100 parts by mass of the sum total of the components (A) to (C), the composition tends to be excellent in low thermal expansion. On the other hand, when 70 parts by mass or less, the thermosetting resin composition tends to have heat resistance and tends to have good flowability and moldability.

In the case where the thermosetting resin composition is made to contain the component (E), the content thereof is preferably 0.5 to 6 parts by mass relative to 100 parts by mass of the sum total of the components (A) to (C).

When the component (E) accounts for 0.5 parts by mass or more relative to 100 parts by mass of the sum total of the components (A) to (C), the composition tends to secure high metal foil adhesion and tends to be excellent in low thermal expansion. On the other hand, when 6 parts by mass or less, the composition tends to secure high heat resistance.

In the case where the thermosetting resin composition is made to contain the component (F), the content thereof is, from the viewpoint of flame retardancy, preferably 0.1 to 20 parts by mass, more preferably 0.5 to 10 parts by mass, relative to 100 parts by mass of the sum total of the components (A) to (C). In particular, when a phosphorus-containing flame retardant is used as the component (F), the content thereof is, from the viewpoint of flame retardancy, preferably 0.1 to 3 parts by mass in terms of the phosphorus atom content, relative to the sum total 100 parts by mass of the components (A) to (C), more preferably 0.2 to 3 parts by mass, even more preferably 0.5 to 3 parts by mass.

<Other Components>

The thermosetting resin composition may optionally contain any other solvents such as additives, the organic solvent (G) and others, within a range not detracting from the advantageous effects of the present invention. One alone or two or more kinds of such other components may be contained in the composition.

(Additives)

Examples of the additives include a curing agent, a curing accelerator, a colorant, an antioxidant, a reducing agent, a UV absorbent, a fluorescent whitening agent, an adhesion improver, an organic filler, etc. One of them may be used singly or two or more thereof may be used in combination.

((G) Organic Solvent)

The thermosetting resin composition may contain an organic solvent from the viewpoint of diluting the composition to facilitate handling thereof and from the viewpoint of facilitating production of prepreg to be mentioned hereinunder. In this description, as mentioned above, the thermosetting resin composition having a solid concentration of 30 to 90% by mass is referred to as a resin varnish.

The organic solvent is not specifically limited, and examples thereof include alcohol solvents such as methanol, ethanol, ethylene glycol, ethylene glycol monomethyl ether, ethylene glycol monoethyl ether, diethylene glycol, triethylene glycol monomethyl ether, triethylene glycol monoethyl ether, triethylene glycol, propylene glycol monomethyl ether, dipropylene glycol monomethyl ether, propylene glycol monopropyl ether, dipropylene glycol monopropyl ether, etc.; ketone solvents such as acetone, methyl ethyl ketone, methyl isobutyl ketone, cyclohexanone, etc.; ether solvents such as tetrahydrofuran, etc.; aromatic solvents such as toluene, xylene, mesitylene, etc.; nitrogen atom-containing solvents including amide solvents such as formamide, N-methylformamide, N, N-dimethylformamide, N, N-dimethylacetamide, N-methylpyrrolidone, etc.; sulfur atom-containing solvents including sulfoxide solvents such as dimethyl sulfoxide, etc.; ester solvents such as methoxyethyl acetate, ethoxyethyl acetate, butoxyethyl acetate, propylene glycol monomethyl ether acetate, ethyl acetate, etc.

Among these, alcohol solvents, ketone solvents and nitrogen atom-containing solvents are preferred from the viewpoint of solubility, methyl ethyl ketone, methyl isobutyl ketone, cyclohexanone, methyl cellosolve and propylene glycol monomethyl ether are more preferred, methyl ethyl ketone and methyl isobutyl ketone are even more preferred, and methyl ethyl ketone is especially preferred.

One of the organic solvents may be used singly or two or more thereof may be used in combination.

The content of the organic solvent in the thermosetting resin composition is not specifically limited but may be adequately so controlled as to facilitate handling of the thermosetting resin composition within a range that betters the coatability with the resin varnish. Preferably, the resin varnish is so prepared that the solid concentration derived from the thermosetting resin composition (the concentration of the components except the organic solvent in the composition) could be preferably 30 to 90% by mass, more preferably 40 to 80% by mass, even more preferably 50 to 80% by mass.

<Production Method for Resin Varnish>

The production method for the resin varnish of the present invention is not specifically limited, but a method of mixing the above-mentioned components (A) to (D) and optionally the above-mentioned components (E) and (F) and further the organic solvent (G) using a mixing machine may be employed. Any known mixing machine can be used, and examples thereof include bead mill-system, high-speed shear dispersion-system, ultrasonic dispersion-system, high-pressure collision dispersion-system, high-speed rotation dispersion-system, rotation and revolution dispersion-system and the like mixing machines.

[Prepreg]

The prepreg of the present invention contains the above-mentioned resin varnish. The production method for the prepreg is not specifically limited. For example, the prepreg may be produced by impregnating or applying the resin varnish to a sheet-like reinforcing substrate followed by semicuring it by heating or the like (for conversion into B-stage).

As the sheet-like reinforcing substrate for the prepreg, any well-known one that is used in laminates for various electric insulating materials can be used. The material of the sheet-like reinforcing substrate includes natural fibers such as paper, cotton linter, etc.; inorganic fibers such as glass fibers, asbestos, etc.; organic fibers such as aramid, polyimide, polyvinyl alcohol, polyester, tetrafluoroethylene, acryl, etc.; mixtures thereof, etc. Among these, glass fibers are preferred from the viewpoint of flame retardancy. Glass fiber substrates include glass woven fabrics prepared by bonding woven fabrics or short fibers of E glass, C glass, D glass, S glass or the like with an organic binder; those prepared by mixing glass fibers and cellulose fibers followed by sheeting the resultant mixture, etc. A glass woven fabric using E glass is more preferred.

These sheet-like reinforcing substrates have various shapes of, for example, woven fabric, nonwoven fabric, roving, chopped strand mat, surfacing mat, etc. The material and the shape can be selected depending on the use and the performance of the intended molded article, and one alone or, as needed, two or more kinds of materials and shapes can be used either singly or as combined.

The method of impregnating or applying the resin varnish to the sheet-like reinforcing substrate is not specifically limited, but a method where an organic solvent is added to the above-mentioned thermosetting resin composition to prepare a resin varnish, then a sheet-like reinforcing substrate is immersed in the resin varnish so as to infiltrate the resin varnish into the sheet-like reinforcing substrate and the substrate is thereafter dried, is preferred.

The thickness of the sheet-like reinforcing substrate is not specifically limited, and may be, for example, about 0.03 to 0.5 mm. A sheet-like reinforcing substrate that has been surface-treated with a silane coupling agent or the like, or that has been mechanically treated for fiber opening is preferred for use herein, from the viewpoint of heat resistance, moisture-proofness and workability. After infiltrated or applied to a substrate, in general, the thermosetting resin composition is dried preferably by heating at a temperature of 100 to 200° C. for 1 to 30 minutes for semicuring (conversion into B-stage), thereby giving a prepreg of the present invention.

One alone or, if desired, 2 to 20 sheets of the prepreg may be used either singly or as combined.

[Laminate]

The laminate of the present invention contains the above-mentioned prepreg and a metal foil. For example, using one sheet or, as needed, 2 to 20 sheets of the prepreg either singly or as layered, a metal foil is arranged on one surface or on both surfaces of the sheet(s) and molded to produce the laminate. The metal foil-arranged laminate may be referred to as a metal-clad laminate.

The metal for the metal foil may be any one used for electric insulating materials with no limitation, but from the viewpoint of electroconductivity, the metal is preferably copper, gold, silver, nickel, platinum, molybdenum, ruthenium, aluminum, tungsten, iron, titanium, chromium, or an alloy containing at least one of these metal elements, and is more preferably copper or aluminium, even more preferably copper.

Regarding the molding condition for the laminate, any known molding method for laminates and multilayer plates for electric insulating materials may be employed. As the molding machine, for example, a multistage press, a multistage vacuum press, a continuous molding machine, an autoclave molding machine or the like may be used for molding under a condition of a temperature of 100 to 250° C., a pressure of 0.2 to 10 MPa, and a heating time of 0.1 to 5 hours.

The prepreg of the present invention may be combined with a printed wiring board for an inner layer, and molded in lamination to produce a multilayer sheet.

The thickness of the metal foil is not specifically limited, and may be adequately selected in accordance with the use of printed wiring boards, etc. The thickness of the metal foil is preferably 0.5 to 150 μm, more preferably 1 to 100 μm, even more preferably 5 to 50 μm, especially preferably 5 to 30 μm.

Preferably, a plating layer may be formed on the metal foil by plating.

The metal for the plating layer is not specifically limited so far as it is a platable metal. The metal of the plating layer is preferably selected from copper, gold, silver, nickel, platinum, molybdenum, ruthenium, aluminum, tungsten, iron, titanium, chromium, and alloys containing at least one of those metal elements.

The plating method is not specifically limited, and any known method, for example, an electrolytic plating method, an electroless plating method or the like is employable.

[Printed Wiring Board]

The present invention also provides a printed wiring board provided with the laminate.

The printed wiring board of the present invention can be produced by working the metal foil of the metal-clad laminate for forming electric circuits thereon. Working for electric circuit formation can be attained, for example, by forming a resist pattern on the surface of a metal foil, then removing the unnecessary part of the metal foil by etching, removing the resist pattern, forming necessary through-holes by drilling, again forming a resist pattern, plating the through-holes for electroconduction, and finally removing the resist pattern. The above-mentioned metal-clad laminate is further laminated on the surface of the resultant printed wiring board under the same condition as mentioned above, and this is further worked for circuit formation in the same manner as above to give a multilayer printed wiring board. In this case, formation of though-holes is not always necessary, and via holes may be formed, or both of them may be formed. Such multilayer formation is carried out for the necessary number of layers to be layered.

EXAMPLES

Next, the present invention is described in more detail with reference to Examples given hereinunder, but these Examples are not whatsoever intended to restrict the present invention. In each Example, a resin varnish, a prepreg and further a copper-clad laminate were produced, and the resultant copper-clad laminate was evaluated. The evaluation methods are shown below.

[Evaluation Methods]

<1. Heat Resistance (Reflow Soldering Heat Resistance)>

The four-layered copper-clad laminate produced in each Example was led to pass through a constant-temperature tank at 260° C. or higher, in which the highest achieving temperature was 266° C., for 30 seconds as one cycle, and the cycle was repeated. The number of cycles in which the substrate was visually confirmed to have swollen was counted. A larger number of cycles indicates more excellent heat resistance.

<2. Relative Permittivity (Dk)>

Using a network analyzer "8722C" (manufactured by HP Development Company) and according to a tri-plate structure straight path resonator method, the relative permittivity of the double-sided copper-clad laminate at 1 GHz was measured. The sample size was 200 mm×50 mm×0.8 mm thickness, and a linear path having a width of 1.0 mm (line length 200 mm) was formed by etching in the center of one surface of one double-sided copper-clad laminate, and on the back thereof, copper was kept remaining to be a ground layer. One surface of another double-sided copper-clad laminate was totally etched, and the back thereof was made to be a ground layer. These two double-sided copper-clad laminates were layered with the ground layer thereof kept outside to be a strip path. The measurement was carried out at 25° C.

A smaller relative permittivity is preferred.

<3. Metal Foil Adhesion (Copper Foil Peel Strength)>

The metal foil adhesion was evaluated based on the copper foil peel strength. The double-sided copper-clad laminate produced in Examples was immersed in a copper etchant "ammonium persulfate (APS)" (manufactured by ADEKA Corporation) to form a copper foil having a width of 3 mm and an evaluation substrate was thus prepared. Using an autograph "AG-100C" (manufactured by Shimadzu Corporation), the copper foil peel strength of the sample was measured. A larger value indicates more excellent metal foil adhesion.

<4. Glass Transition Temperature (Tg)>

The double-sided copper-clad laminate produced in Examples was immersed in a copper etchant "ammonium persulfate (APS)" (manufactured by ADEKA Corporation) to remove the copper foil, thereby preparing an evaluation substrate of 5 mm square. Using a TMA tester "Q400EM" (manufactured by TA Instruments Corporation), the thermal expansion curve at 30 to 260° C. in the plane direction (Z direction) of the evaluation substrate was drawn, and the inflection point of the expansion is referred to as the glass transition temperature.

<5. Low Thermal Expansion>

The double-sided copper-clad laminate produced in Examples was immersed in a copper etchant "ammonium persulfate (APS)" (manufactured by ADEKA Corporation) to remove the copper foil, thereby preparing an evaluation substrate of 5 mm square. Using a TMA tester "Q400EM" (manufactured by TA Instruments Corporation), the thermal expansion rate (linear thermal expansion rate) in the plane direction of the evaluation substrate was measured. For removing the influence of heat strain of the evaluation substrate, the heating-cooling cycle was repeated twice, and on the second-run temperature fluctuation chart, the thermal expansion rate at 30° C. to 260° C. [ppm/° C.] was read to be the index of low thermal expansion characteristic. A smaller value indicates more excellent low thermal expansion. In the Table, the data were separately shown as the thermal expansion rate at lower than Tg (expressed as "<Tg") and as the thermal expansion rate at higher than Tg (expressed as ">Tg").

Measurement Condition

1st run: room temperature→210° C. (heating rate 10° C./min)

2nd run: 0° C.→270° C. (heating rate 10° C./min)

Copper-clad laminates are desired to be thinned more, and with this, thinning of prepreg to constitute copper-clad laminates is now under investigation. A thinned prepreg may readily warp, and it is desired to reduce warping of prepreg in thermal treatment. For reducing warping, it is effective to reduce the thermal expansion rate in the plane direction of substrate.

<6. Platability (Laser Workability)>

Using a laser machine "LC-2F21B/2C" (manufactured by Hitachi Via Mechanics, Ltd.), the four-layer copper-clad laminate produced in Examples was worked for laser holing according to a copper direct method in a Gaussian cycle-by-cycle mode with a targeted hole diameter of 80 µm, a pulse width of 15 µs×once and 7 µs×four times.

The resultant laser-holed substrate was processed with a swelling liquid "Swelling Dip Securiganth (registered trademark) P" (manufactured by Atotech Japan, Ltd.) at 70° C. for 5 minutes, then processed with a roughening liquid "Dosing Securiganth (registered trademark) P500J (manufactured by Atotech Japan, Ltd.) at 70° C. for 9 minutes, and thereafter processed with a neutralizing liquid "Reduction Conditioner Securiganth (registered trademark) P500" (manufactured by Atotech Japan, Ltd.) at 40° C. for 5 minutes for desmearing treatment. Subsequently, using an electroless plating liquid "Printganth (registered trademark) MSK-DK" (manufactured by Atotech Japan, Ltd.), this was electrolessly plated at 30° C. for 20 minutes, and then using an electrolytic plating liquid "Cupracid HL" (manufactured by Atotech Japan, Ltd.), this was electrolytically plated at 24° C. and at 2 A/dm$^2$ for 2 hours, and through the process, the laser-worked substrate was plated.

The cross section of the resultant laser-holed substrate was observed to confirm the platability thereof. Regarding the evaluation method for platability, the difference between the plating thickness at the top of the laser hole and the plating thickness at the bottom of the laser hole was calculated, and when the difference was within 10% of the plating thickness at the top of the laser hole, the platability was considered to be good. The proportion of the holes (%) falling within the range of 100 holes was calculated.

<7. Moldability>

Copper of each outer layer was removed from the four-layer copper-clad laminate produced in Examples, and the presence or absence of void or obscure appearance in a plane of 340×500 mm was confirmed visually for evaluating resin burying performance. The case with neither void nor obscure appearance was evaluated as "good". Absence of void and obscure appearance indicates good moldability.

The components used in Examples and Comparative Examples are described below.

Component (A): A solution of the maleimide compound produced in the following Production Example 1 was used.

Production Example 1

19.2 g of 4,4'-diaminodiphenylmethane, 174.0 g of bis(4-maleimidephenyl)methane, 6.6 g of p-aminophenol and 330.0 g of dimethylacetamide were put in a reactor equipped with a thermometer, a stirrer and a water metering device with a reflux condenser tube and having a volume of 1 L, and reacted therein at 100° C. for 2 hours to give a dimethylacetamide solution of a maleimide compound having an acidic substituent and an N-substituted maleimide group (Mw=1,370). This was used as the component (A).

The weight average molecular weight (Mw) was determined through gel permeation chromatography (GPC) with a standard polystyrene-equivalent calibration curve. The calibration curve was approximated in a cubic equation using standard polystyrene: TSK standard POLYSTYRENE (Type: A-2500, A-5000, F-1, F-2, F-4, F-10, F-20, F-40) (manufactured by Tosoh Corporation). The GPC condition is shown below.

Apparatus:
(Pump: L-6200 Model [manufactured by Hitachi High Technologies, Ltd.])
(Detector: L-3300 Model RI [manufactured by Hitachi High Technologies, Ltd.])
(Column Oven: L-655A-52 [manufactured by Hitachi High Technologies, Ltd.])
Columns: TSKgel Super HZ2000+TSKgel Super HZ2300 (all manufactured by Tosoh Corporation)
Column Size: 6.0×40 mm (guard column), 7.8×300 mm (column)
Eluent: tetrahydrofuran
Sample Concentration: 20 mg/5 mL
Injection Amount: 10 μL
Flow Rate: 0.5 mL/min
Measurement Temperature: 40° C.

Component (B): Cresol-novolak epoxy resin "EPICLON (registered trademark) N-673" (manufactured by DIC Corporation)

Component (C-1): "SMA (registered trademark) EF40" (styrene/maleic anhydride=4, Mw=11,000, manufactured by Cray Valley Corporation)

Component (C-2): "SMA (registered trademark) 3000" (styrene/maleic anhydride=2, Mw=7,500, manufactured by Cray Valley Corporation)

Component (C-3): "SMA (registered trademark) EF80" (styrene/maleic anhydride=8, Mw=14,400, manufactured by Cray Valley Corporation)

Component (C-4): "SMA (registered trademark) 1000" (styrene/maleic anhydride=1, Mw=5,000, manufactured by Cray Valley Corporation)

Component (D): "Megasil 525 ARI" (molten silica treated with aminosilane coupling agent, mean particle diameter: 1.9 μm, specific surface area 5.8 m²/g, manufactured by Sibelco Japan, Inc.)

Inorganic Filler: "F05-30" (untreated ground silica, mean particle diameter: 4.2 μm, specific surface area 5.8 m²/g, manufactured by Fumitec Co., Ltd.)

Component (E): Dicyandiamide (manufactured by Nippon Carbide Industries Co., Inc.)

Component (F): "PX-200" (aromatic phosphate (see the following structural formula), manufactured by Daihachi Chemical Co., Ltd.)

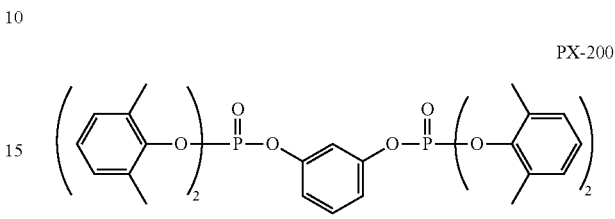

PX-200

Examples 1 to 13, Comparative Example 1

The components (A) to (F) mentioned above were blended in the formulation shown in Tables 1 to 4 (in the case of a solution or a dispersion, the formulation is in terms of the solid content of each component), and as the organic solvent (G), methyl ethyl ketone (hereinafter this may be referred to as MEK) was added thereto to prepare resin varnishes of Examples and Comparative Example.

The resultant resin varnish was infiltrated into a glass cloth (0.1 mm) of IPC Standard #3313, and dried at 160° C. for 4 minutes to produce a prepreg.

Eight sheets of the prepreg produced in the above were layered, and an 18 μm-thick copper foil "3EC-VLP-18" (manufactured by Mitsui Metal Mining & Smelting Co., Ltd.) was further layered on both surfaces of the resultant structure, and molded by thermal pressing at a temperature of 190° C. and a pressure of 25 kgf/cm² (2.45 MPa) for 90 minutes, thereby producing a double-sided copper-clad laminate having a thickness of 0.8 mm (corresponding to 8 sheets of prepreg). According to the above-mentioned methods, the double-sided copper-clad laminate was measured for evaluation of the relative permittivity, the metal foil adhesion, the glass transition temperature (Tg) and the low thermal expansion.

On the other hand, one sheet of the prepreg produced in the above was used, and an 18 μm-thick copper foil "YGP-18" (manufactured by Nippon Denkai, Ltd.) was layered on both surfaces of one sheet of the prepreg produced in the above, and molded by thermal pressing at a temperature of 190° C. and a pressure of 25 kgf/cm² (2.45 MPa) for 90 minutes, thereby producing a double-sided copper-clad laminate having a thickness of 0.1 mm (corresponding to one sheet of prepreg). Next, both copper surfaces of the double-sided copper-clad laminate were processed for inner layer adhesion reinforcement treatment (using a "BF processing liquid" (manufactured by Hitachi Chemical Co., Ltd.), and then one sheet of the prepreg having a thickness of 0.05 mm and an 18 μm-thick copper foil "YGP-18" (manufactured by Nippon Denkai, Ltd.) were layered in that order on both copper surfaces of the laminate and molded by thermal pressing at a temperature of 190° C. and a pressure of 25 kgf/cm² (2.45 MPa) for 90 minutes, thereby producing a four-layer copper-clad laminate. According to the above-mentioned methods, the four-layer copper-clad laminate was evaluated for the heat resistance, the platability and the moldability.

The results are shown in Tables 1 to 4.

TABLE 1

|  |  | Unit | Example 1 | Example 2 | Example 3 | Example 4 | Example 5 |
|---|---|---|---|---|---|---|---|
| Components | Component (A) | part by mass | 45 | 65 | 15 | 40 | 30 |
|  | Component (B) | part by mass | 30 | 20 | 50 | 25 | 50 |
|  | Component (C-1) | part by mass | 25 | 15 | 30 | 35 | 20 |
|  | Component (C-2) | part by mass | — | — | — | — | — |
|  | Component (C-3) | part by mass | — | — | — | — | — |
|  | Component (C-4) | part by mass | — | — | — | — | — |
|  | Component (D) | part by mass | 50 | 70 | 30 | 40 | 60 |
|  | Inorganic Filler | part by mass | — | — | — | — | — |
|  | Component (E) | part by mass | 2 | 2 | 2 | 2 | 2 |
|  | Flame Retardant (F)[1] | part by mass | 2.0 | 2.0 | 2.0 | 2.0 | 2.0 |
|  | Organic Solvent (G) (MEK)[2] | % | 67 | 67 | 67 | 67 | 67 |
| Evaluation Results | 1. Heat Resistance | number of cycles | ≥10 | ≥10 | ≥10 | ≥10 | ≥10 |
|  | 2. Relative Permittivity (1 GHz) | — | 3.8 | 3.8 | 3.9 | 3.8 | 3.8 |
|  | 3. Metal Foil Adhesion | kN/m | 1.1 | 1.1 | 1.2 | 1.1 | 1.2 |
|  | 4. Glass Transition Temperature | °C. | 157 | 161 | 155 | 160 | 158 |
|  | 5. Thermal Expansion Rate <Tg | ppm/°C. | 42 | 34 | 48 | 43 | 46 |
|  | >Tg | ppm/°C. | 211 | 202 | 217 | 215 | 208 |
|  | 6. Platability | % | 86 | 87 | 84 | 83 | 85 |
|  | 7. Moldability | — | good | good | good | good | good |

[1]Phosphorus atom-equivalent amount
[2]Expressed as solid concentration in the resultant resin varnish

TABLE 2

|  |  | Unit | Example 6 | Example 7 | Example 8 | Example 9 | Example 10 |
|---|---|---|---|---|---|---|---|
| Components | Component (A) | part by mass | 55 | 45 | 30 | 60 | 45 |
|  | Component (B) | part by mass | 15 | 45 | 30 | 20 | 30 |
|  | Component (C-1) | part by mass | 30 | 10 | 40 | 20 | 25 |
|  | Component (C-2) | part by mass | — | — | — | — | — |
|  | Component (C-3) | part by mass | — | — | — | — | — |
|  | Component (C-4) | part by mass | — | — | — | — | — |
|  | Component (D) | part by mass | 50 | 50 | 50 | 50 | 50 |
|  | Inorganic Filler | part by mass | — | — | — | — | — |
|  | Component (E) | part by mass | 2 | 2 | 2 | 0.5 | 5 |
|  | Flame Retardant (F)[1] | part by mass | 2.0 | 2.0 | 2.0 | 2.0 | 2.0 |
|  | Organic Solvent (G) (MEK)[2] | % | 67 | 67 | 67 | 67 | 67 |
| Evaluation Results | 1. Heat Resistance | number of cycles | ≥10 | ≥10 | ≥10 | ≥10 | ≥10 |
|  | 2. Relative Permittivity (1 GHz) | — | 3.8 | 3.9 | 3.8 | 3.8 | 3.8 |
|  | 3. Metal Foil Adhesion | kN/m | 1.1 | 1.1 | 1.1 | 1.1 | 1.2 |
|  | 4. Glass Transition Temperature | °C. | 160 | 156 | 155 | 160 | 158 |
|  | 5. Thermal Expansion Rate <Tg | ppm/°C. | 48 | 42 | 48 | 44 | 45 |
|  | >Tg | ppm/°C. | 210 | 211 | 212 | 210 | 206 |
|  | 6. Platability | % | 83 | 86 | 85 | 83 | 85 |
|  | 7. Moldability | — | good | good | good | good | good |

[1]Phosphorus atom-equivalent amount
[2]Expressed as solid concentration in the resultant resin varnish

TABLE 3

|  |  | Unit | Example 11 | Example 12 | Example 13 |
|---|---|---|---|---|---|
| Components | Component (A) | part by mass | 45 | 45 | 45 |
|  | Component (B) | part by mass | 30 | 30 | 30 |
|  | Component (C-1) | part by mass | — | — | — |
|  | Component (C-2) | part by mass | 25 | — | — |
|  | Component (C-3) | part by mass | — | 25 | — |
|  | Component (C-4) | part by mass | — | — | 25 |
|  | Component (D) | part by mass | 50 | 50 | 50 |
|  | Inorganic Filler | part by mass | — | — | — |

TABLE 3-continued

|  |  | Unit | Example 11 | Example 12 | Example 13 |
|---|---|---|---|---|---|
|  | Component (E) | part by mass | 2 | 2 | 2 |
|  | Flame Retardant (F)*1 | part by mass | 2.0 | 2.0 | 2.0 |
|  | Organic Solvent (G) (MEK)*2 | % | 67 | 67 | 67 |
| Evaluation Results | 1. Heat Resistance | number of cycles | ≥10 | ≥10 | ≥10 |
|  | 2. Relative Permittivity (1 GHz) | — | 3.9 | 3.8 | 4.0 |
|  | 3. Metal Foil Adhesion | kN/m | 1.1 | 1.0 | 1.1 |
|  | 4. Glass Transition Temperature | ° C. | 160 | 161 | 160 |
|  | 5. Thermal Expansion Rate <Tg | ppm/° C. | 44 | 43 | 44 |
|  | >Tg | ppm/° C. | 209 | 211 | 215 |
|  | 6. Platability | % | 81 | 82 | 88 |
|  | 7. Moldability | — | good | good | good |

*1Phosphorus atom-equivalent amount
*2Expressed as solid concentration in the resultant resin varnish

TABLE 4

|  |  | Unit | Comparative Example 1 |
|---|---|---|---|
| Components | Component (A) | part by mass | 40 |
|  | Component (B) | part by mass | 30 |
|  | Component (C-1) | part by mass | 30 |
|  | Component (C-2) | part by mass | — |
|  | Component (C-3) | part by mass | — |
|  | Component (C-4) | part by mass | — |
|  | Component (D) | part by mass | — |
|  | Inorganic Filler | part by mass | 50 |
|  | Component (E) | part by mass | 2 |
|  | Flame Retardant (F)*1 | part by mass | 2.0 |
|  | Organic Solvent (G) (MEK)*2 | % | 67 |
| Evaluation Results | 1. Heat Resistance | number of cycles | ≥10 |
|  | 2. Relative Permittivity (1 GHz) | — | 3.8 |
|  | 3. Metal Foil Adhesion | kN/m | 1.1 |
|  | 4. Glass Transition Temperature | ° C. | 156 |
|  | 5. Thermal Expansion Rate <Tg | ppm/° C. | 48 |
|  | >Tg | ppm/° C. | 210 |
|  | 6. Platability | % | 57 |
|  | 7. Moldability | — | good |

*1Phosphorus atom-equivalent amount
*2Expressed as solid concentration in the resultant resin varnish In Examples, the reflow soldering heat resistance attained 10 cycles or more above the required heat resistance level, and the samples all realized low relative permittivity, high metal foil adhesion and high glass transition temperature, and in addition, exhibited low thermal expansion. In addition, glass cloth adequately protruded out from the wall surface and the wall surface adequately roughened, and therefore the samples were confirmed to have good platability. The resin were well buried in point moldability, and any abnormalities of obscure appearance, voids and the like were not detected. Among these, the samples in Examples 1 to 10 were better than those in Examples 11 to 13 in point of the relative permittivity and the metal foil adhesion, and the other characteristics thereof were stably expressed.

On the other hand, in Comparative Example 1 where a silica not treated with an aminosilane coupling agent was used as the inorganic filler, the desmearing dissolution amount was large, the wall surface of the laser hole much roughened and the glass cloth protrusion from the wall surface was large to increase the hole size, and the platability was thereby greatly worsened.

INDUSTRIAL APPLICABILITY

The resin varnish, the prepreg and the laminate of the present invention have high heat resistance, low relative permittivity, high metal foil adhesion, high glass transition temperature and low thermal expansion, and are excellent in moldability and platability, and are therefore useful for printed wiring boards for electronic devices.

The invention claimed is:

1. A resin varnish comprising:
   (A) a maleimide compound,
   (B) an epoxy resin,
   (C) a copolymer resin having a structural unit derived from an aromatic vinyl compound and a structural unit derived from a maleic anhydride,
   (D) a silica treated with an aminosilane coupling agent, and
   (G) an organic solvent.

2. The resin varnish according to claim 1, wherein the component (A) is a maleimide compound having an acidic substituent and an N-substituted maleimide group, which is obtained by reacting (a1) a maleimide compound having at least two N-substituted maleimide groups in one molecule, (a2) a monoamine compound having an acidic substituent, and (a3) a diamine compound.

3. The resin varnish according to claim 1, wherein the component (A) is a maleimide compound having an acidic substituent and an N-substituted maleimide group, which is obtained by reacting (a1) a maleimide compound having at least two N-substituted maleimide groups in one molecule, (a2) a monoamine compound represented by the following general formula (a2-1), and (a3) a diamine compound represented by the following general formula (a3-1):

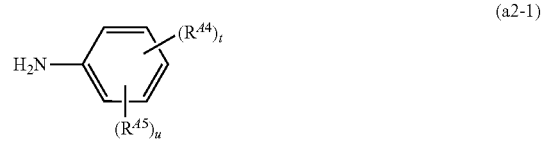

(a2-1)

wherein $R^{44}$ represents an acidic substituent selected from a hydroxy group, a carboxy group and a sulfonic acid group, $R^{45}$ represents an alkyl group having 1 to 5 carbon atoms or a halogen atom, t represents an integer of 1 to 5, u represents an integer of 0 to 4, and t and u satisfy $1 \leq t+u \leq 5$, provided that when t is an integer of 2 to 5, plural $R^{44}$'s may be the same or different, and when u is an integer of 2 to 4, plural $R^{45}$'s may be the same or different;

(a3-1)

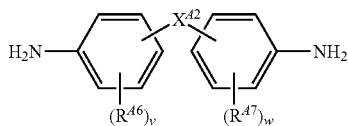

wherein $X^{A2}$ represents an aliphatic hydrocarbon group having 1 to 3 carbon atoms, or —O—, $R^{A6}$ and $R^{A7}$ each independently represent an alkyl group having 1 to 5 carbon atoms, a halogen atom, a hydroxy group, a carboxy group or a sulfonic acid group, and v and w each independently represent an integer of 0 to 4.

4. The resin varnish according to claim 1, wherein the component (C) is a copolymer resin having a structural unit represented by the following general formula (C-i) and a structural unit represented by the following formula (C-ii):

(C-i)

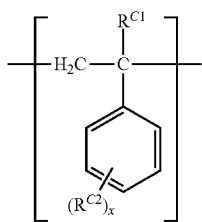

(C-ii)

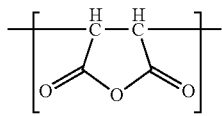

wherein $R^{C1}$ represents a hydrogen atom, or an alkyl group having 1 to 5 carbon atoms, $R^{C2}$ represents an alkyl group having 1 to 5 carbon atoms, an alkenyl group having 2 to 5 carbon atoms, an aryl group having 6 to 20 carbon atoms, a hydroxy group, or a (meth) acryloyl group, and x represents an integer of 0 to 3, provided that when x is 2 or 3, plural $R^{C2}$'s may be the same or different.

5. The resin varnish according to claim 4, wherein in the general formula (C-i), $R^{C1}$ is a hydrogen atom and x is 0.

6. The resin varnish according to claim 1, wherein in the component (C), the content ratio of the structural unit derived from an aromatic vinyl compound to the structural unit derived from a maleic anhydride [aromatic vinyl compound-derived structural unit/maleic anhydride-derived structural unit] (molar ratio) is from 2 to 9.

7. The resin varnish according to claim 1, wherein in the component (C), the content ratio of the structural unit derived from an aromatic vinyl compound to the structural unit derived from a maleic anhydride [aromatic vinyl compound-derived structural unit/maleic anhydride-derived structural unit] (molar ratio) is from 3 to 7.

8. The resin varnish according to claim 1, wherein the weight average molecular weight of the component (C) is from 4,500 to 18,000.

9. The resin varnish according to claim 1, wherein the weight average molecular weight of the component (C) is from 9,000 to 13,000.

10. The resin varnish according to claim 1, wherein the component (B) is a bisphenol F epoxy resin, a phenol-novolak epoxy resin, a cresol-novolak epoxy resin, a naphthalene epoxy resin, an anthracene epoxy resin, a biphenyl epoxy resin, a biphenylaralkyl epoxy resin or a dicyclopentadiene epoxy resin.

11. The resin varnish according to claim 1, further comprising
(E) a curing agent.

12. The resin varnish according to claim 1, further comprising
(F) a flame retardant.

13. The resin varnish according to claim 1, wherein the organic solvent (G) is at least one selected from the group consisting of an alcohol solvent, a ketone solvent, an ether solvent, an aromatic solvent, a nitrogen atom-containing solvent, a sulfur atom-containing solvent and an ester solvent.

14. A prepreg comprising a resin varnish of claim 1.

15. A laminate comprising a prepreg of claim 14 and a metal foil.

16. A printed wiring board provided with a laminate of claim 15.

* * * * *